(12) United States Patent
Smith et al.

(10) Patent No.: US 11,934,105 B2
(45) Date of Patent: Mar. 19, 2024

(54) OPTICAL OBJECTIVE FOR OPERATION IN EUV SPECTRAL REGION

(71) Applicant: Nikon Corporation, Tokyo (JP)

(72) Inventors: Daniel Gene Smith, Tucson, AZ (US); David M. Williamson, Tucson, AZ (US)

(73) Assignee: Nikon Corporation, Tokyo (JP)

( * ) Notice: Subject to any disclaimer, the term of this patent is extended or adjusted under 35 U.S.C. 154(b) by 878 days.

(21) Appl. No.: 16/655,932

(22) Filed: Oct. 17, 2019

(65) Prior Publication Data
US 2020/0117099 A1 Apr. 16, 2020

Related U.S. Application Data

(63) Continuation of application No. PCT/US2018/027785, filed on Apr. 16, 2018, which is a continuation-in-part of application No. 15/599,148, filed on May 18, 2017, now Pat. No. 11,099,483, and a continuation-in-part of application
(Continued)

(51) Int. Cl.
*G03F 7/20* (2006.01)
*G03F 7/00* (2006.01)
*G02B 17/06* (2006.01)

(52) U.S. Cl.
CPC ...... *G03F 7/70166* (2013.01); *G03F 7/70233* (2013.01); *G02B 17/0663* (2013.01)

(58) Field of Classification Search
CPC .. G03F 7/70166; G03F 7/70233; G03F 7/703; G02B 17/0663; G02B 17/061
See application file for complete search history.

(56) References Cited

U.S. PATENT DOCUMENTS

| 3,884,573 A | 5/1975 | Franklin |
| 4,924,257 A | 5/1990 | Jain |
| 5,003,567 A | 3/1991 | Hawryluk et al. |
| (Continued) | | |

FOREIGN PATENT DOCUMENTS

| CN | 102754009 A | 10/2012 |
| CN | 103309168 A | 9/2013 |
| (Continued) | | |

OTHER PUBLICATIONS

Office Action issued in Chinese Patent Application No. 201880026044. 8, dated May 28, 2021, 16 pages (with English translation, 25 pages).
(Continued)

*Primary Examiner* — Mesfin T Asfaw
(74) *Attorney, Agent, or Firm* — Klarquist Sparkman, LLP

(57) ABSTRACT

A catoptric system having a reference axis and first, second, and third reflectors. The first reflector contains a pattern-source carrying a substantially one-dimensional pattern. A combination of the second and third reflectors is configured to form an optical image of the pattern, with a demagnification coefficient N>1 in extreme UV light, and with only two beams of light that have originated at the first reflector as a result of irradiation of the first reflector with light incident upon it. An exposure apparatus employing the catoptric system and method of device manufacturing with the use of the exposure apparatus.

44 Claims, 30 Drawing Sheets

Related U.S. Application Data

No. 15/599,197, filed on May 18, 2017, now Pat. No. 10,890,849.

(60) Provisional application No. 62/504,908, filed on May 11, 2017, provisional application No. 62/490,313, filed on Apr. 26, 2017, provisional application No. 62/487,245, filed on Apr. 19, 2017.

(56) References Cited

U.S. PATENT DOCUMENTS

| | | |
|---|---|---|
| 5,144,363 A | 9/1992 | Wittekoek et al. |
| 5,212,588 A | 5/1993 | Viswanathan et al. |
| 5,477,304 A | 12/1995 | Nishi |
| 5,623,853 A | 4/1997 | Novak et al. |
| 5,668,672 A | 9/1997 | Oomura |
| 5,689,377 A | 11/1997 | Takahashi |
| 5,835,275 A | 11/1998 | Takahashi et al. |
| 5,854,671 A | 12/1998 | Nishi |
| 5,874,820 A | 2/1999 | Lee |
| 5,892,117 A | 4/1999 | Theriot |
| 6,014,421 A | 1/2000 | Chiba et al. |
| 6,198,173 B1 | 3/2001 | Schultz et al. |
| 6,331,710 B1 | 12/2001 | Wang et al. |
| 7,817,246 B2 * | 10/2010 | Mickan ............... G03F 7/70175 355/55 |
| 8,223,345 B2 | 7/2012 | Hidaka et al. |
| 8,411,249 B2 | 4/2013 | Hidaka et al. |
| 8,502,978 B2 | 8/2013 | Hidaka |
| 8,599,387 B2 | 12/2013 | Hidaka |
| 8,705,170 B2 | 4/2014 | Williamson et al. |
| 2002/0093636 A1 | 7/2002 | Komatsuda |
| 2004/0165169 A1 | 8/2004 | Teunissen et al. |
| 2004/0256575 A1 | 12/2004 | Singer et al. |
| 2008/0151211 A1 | 6/2008 | Kaiser et al. |
| 2009/0130569 A1 | 5/2009 | Quesnel |
| 2009/0257042 A1 | 10/2009 | Komatsuda |
| 2009/0268182 A1 | 10/2009 | Staals et al. |
| 2010/0053584 A1 | 3/2010 | Kajiyama et al. |
| 2011/0013162 A1 | 1/2011 | Kiuchi et al. |
| 2011/0071784 A1 | 3/2011 | Smith et al. |
| 2012/0008150 A1 | 1/2012 | Smith et al. |
| 2012/0274917 A1 | 11/2012 | Mann et al. |
| 2012/0287414 A1 | 11/2012 | Fiolka et al. |
| 2013/0070227 A1 | 3/2013 | Mueller et al. |
| 2013/0188084 A1 | 7/2013 | Goodwin |
| 2013/0244139 A1 | 9/2013 | Liu et al. |
| 2013/0258305 A1 | 10/2013 | Johnson |
| 2013/0308140 A1 | 11/2013 | Goodwin et al. |
| 2013/0330662 A1 | 12/2013 | Goodwin |
| 2014/0049761 A1 | 2/2014 | Goodwin et al. |
| 2014/0218713 A1 | 8/2014 | Lu et al. |
| 2014/0233011 A1 | 8/2014 | Goodwin et al. |
| 2014/0253892 A1 | 9/2014 | Yu et al. |
| 2014/0268086 A1 | 9/2014 | Lu et al. |
| 2015/0049321 A1 | 2/2015 | Bieling et al. |
| 2016/0033866 A1 | 2/2016 | Lu et al. |
| 2016/0313646 A1 | 10/2016 | Dinger et al. |

FOREIGN PATENT DOCUMENTS

| | | |
|---|---|---|
| CN | 103969962 A | 8/2014 |
| CN | 104335096 A | 2/2015 |
| JP | 2001027699 | 1/2001 |
| TW | 201232187 | 8/2012 |
| TW | 201232187 A | 8/2012 |
| WO | WO 2012/177663 | 12/2012 |
| WO | 2013174644 A1 | 11/2013 |
| WO | WO 2017/199096 | 11/2017 |

OTHER PUBLICATIONS

Ceglio et al., "Front-end design issues in soft-x-ray projection lithography," Applied Optics, 32:7050-7056 (Dec. 1, 1993).

International Preliminary Report on Patentability from International Application No. PCT/US2018/027785, dated Oct. 22, 2019, 22 pages.

International Preliminary Report on Patentability from International Application No. PCT/US2018/029160, dated Oct. 29, 2019, 17 pages.

International Preliminary Report on Patentability from International Application No. PCT/US2018/031796, dated Nov. 12, 2019, 21 pages.

International Search Report and Written Opinion from International Application No. PCT/US2018/029160, dated Oct. 17, 2018, 23 pages.

"Office Action issued in Chinese Patent Application No. 201880030036.0, dated Jun. 23, 2021, 12 pages (with English translation, 17 pages)."

Office Action issued in Chinese Patent Application No. 201880026044.8, dated Mar. 4, 2022, 15 pages (with English translation, 18 pages).

Office Action issued in Taiwanese Patent Application No. 107113155, dated Dec. 20, 2021, 5 pages (with English translation, 3 pages).

International Search Report from International Application No. PCT/US2012/043186, dated Sep. 14, 2012, 3 pages.

International Search Report and Written Opinion from International Application No. PCT/US2018/027785, dated Jan. 4, 2019, 28 pages.

Non-final Office action from U.S. Appl. No. 15/629,353, dated Jun. 20, 2018, 15 pages.

Office Action issued in Chinese Patent Application No. 201880027134.9, dated Apr. 23, 2021, 9 pages (with English translation, 9 pages).

Office Action issued in Taiwanese Patent Application No. 11121027720, dated Oct. 19, 2022, 5 pages (with English translation, 2 pages).

Decision of Rejection issued in Chinese Application No. 2018800260448, dated Oct. 8, 2022, 10 pages (with English translation, 24 pages).

Office Action issued in Chinese Patent Application No. 201880026044.8, dated Apr. 28, 2023, 10 pages (with English translation, 25 pages).

Office Action Issued in Chinese Patent Application No. 201880026044.8, dated Nov. 29, 2023, 8 pages (with English translation, 20 pages).

\* cited by examiner

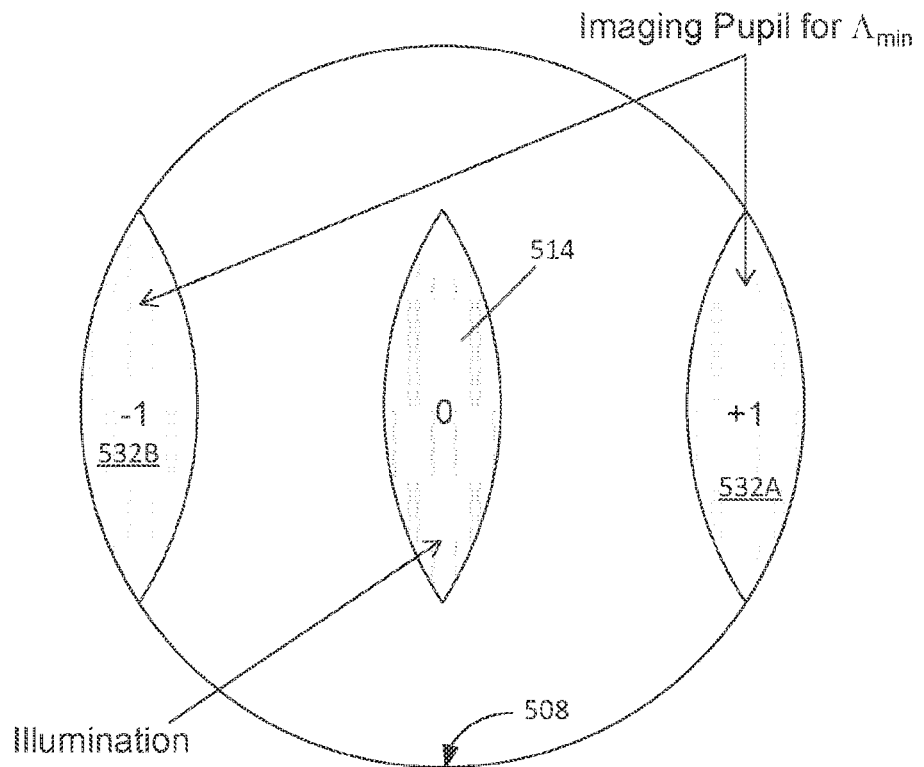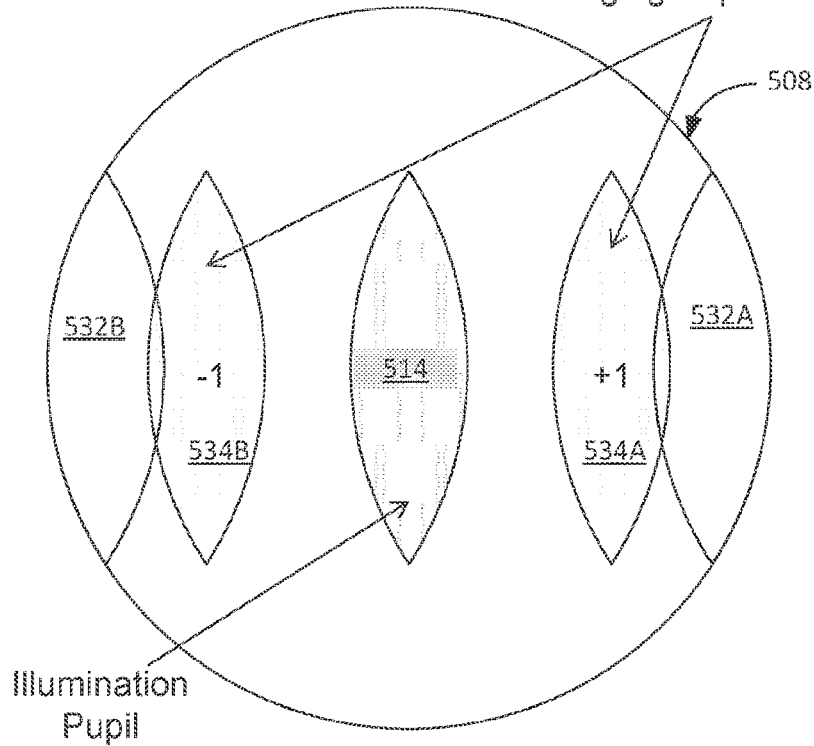

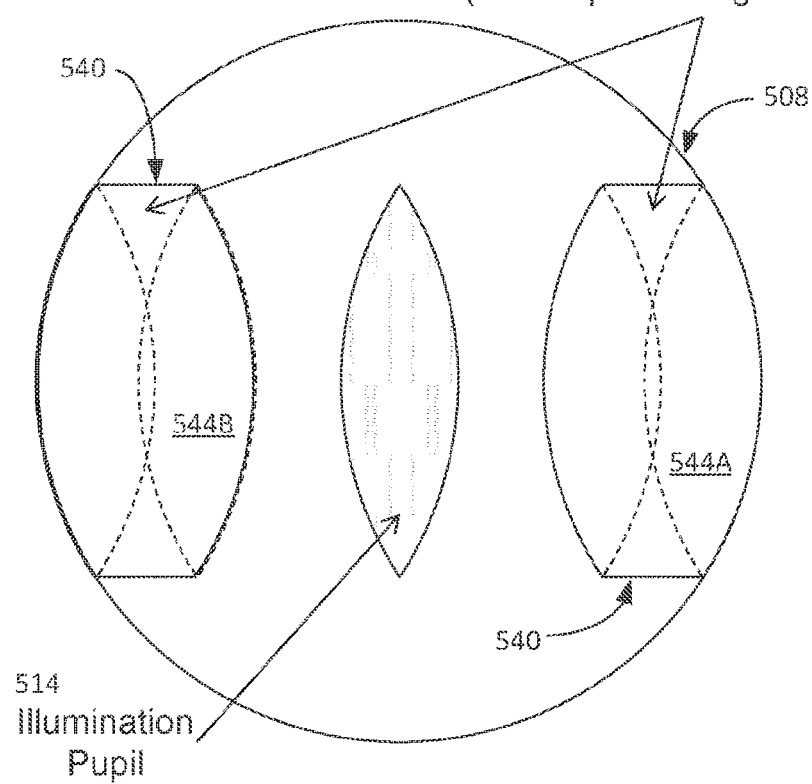

$\Lambda_{min}$ and $\Lambda_{max}$ are the wafer-scale grating pitches (they are halved by zero-order cut and halved again by litho)

| TERM | FRINGE ZERNIKE POLYNOMIAL | ABERRATION TYPE |
|---|---|---|
| 1 | 1 | PISTON (CONSTANT) |
| 2 | $R \cos\theta$ | DISTORTION - TILT (x-AXIS) |
| 3 | $R \sin\theta$ | DISTORTION - TILT (y-AXIS) |
| 4 | $2R^2 - 1$ | DEFOCUS - FIELD CURVATURE |
| 5 | $R^2 \cos(2\theta)$ | ASTIGMATISM, PRIMARY (AXIS AT 0° OR 90°) |
| 6 | $R^2 \sin(2\theta)$ | ASTIGMATISM, PRIMARY (AXIS at ±45°) |
| 7 | $(3R^3 - 2R) \cos\theta$ | COMA, PRIMARY (x-AXIS) |
| 8 | $(3R^3 - 2R) \sin\theta$ | COMA, PRIMARY (y-AXIS) |
| 9 | $6R^4 - 6R^2 + 1$ | SPHERICAL ABERRATION, PRIMARY |
| 10 | $R^3 \cos(3\theta)$ | TREFOIL, PRIMARY (x-AXIS) |
| 11 | $R^3 \sin(3\theta)$ | TREFOIL, PRIMARY (y-AXIS) |
| 12 | $(4R^4 - 3R^2) \cos(2\theta)$ | ASTIGMATISM, SECONDARY (AXIS AT 0° OR 90°) |
| 13 | $(4R^4 - 3R^2) \sin(2\theta)$ | ASTIGMATISM, SECONDARY (AXIS at ±45°) |
| 14 | $(10R^5 - 12R^3 + 3R) \cos\theta$ | COMA, SECONDARY (x-AXIS) |
| 15 | $(10R^5 - 12R^3 + 3R) \sin\theta$ | COMA, SECONDARY (y-AXIS) |
| 16 | $20R^6 - 30R^4 + 12R^2 - 1$ | SPHERICAL ABERRATION, SECONDARY |
| 17 | $R^4 \cos(4\theta)$ | TREFOIL, PRIMARY (x-AXIS) |
| 18 | $R^4 \sin(4\theta)$ | TREFOIL, PRIMARY (y-AXIS) |
| 19 | $(5R^5 - 4R^3) \cos(3\theta)$ | TREFOIL, SECONDARY (x-AXIS) |
| 20 | $(5R^5 - 4R^3) \sin(3\theta)$ | TREFOIL, SECONDARY (Y-AXIS) |
| 21 | $(15R^6 - 20R^4 + 6R^2) \cos(2\theta)$ | ASTIGMATISM, TERTIARY (AXIS AT 0° OR 90°) |

*FIG. 7A*

| TERM | FRINGE ZERNIKE POLYNOMIAL | ABERRATION TYPE |
|---|---|---|
| 22 | $(15R^6 - 20R^4 + 6R^2)\sin(2\theta)$ | ASTIGMATISM, SECONDARY (AXIS at $\pm 45°$) |
| 23 | $(35R^7 - 60R^5 + 30R^3 - 4R)\cos\theta$ | COMA, SECONDARY (x-AXIS) |
| 24 | $(35R^7 - 60R^5 + 30R^3 - 4R)\sin\theta$ | COMA, SECONDARY (y-AXIS) |
| 25 | $70R^8 - 140R^6 + 90R^4 - 20R^2 + 1$ | SPHERICAL ABERRATION, TERTIARY |
| 26 | $R^5 \cos(5\theta)$ | PENTAFOIL, PRIMARY (x-AXIS) |
| 27 | $R^5 \sin(5\theta)$ | PENTAFOIL, PRIMARY (y-AXIS) |
| 28 | $(6R^6 - 5R^4)\cos(4\theta)$ | TETRAFOIL, SECONDARY (x-AXIS) |
| 29 | $(6R^6 - 5R^4)\sin(4\theta)$ | TETRAFOIL, SECONDARY (y-AXIS) |
| 30 | $(21R^7 - 30R^5 + 10R^3)\cos(3\theta)$ | TREFOIL, TERTIARY (x-AXIS) |
| 31 | $(21R^7 - 30R^5 + 10R^3)\sin(3\theta)$ | TREFOIL, TERTIARY (y-AXIS) |
| 32 | $(56R^8 - 105R^6 + 60R^4 - 10R^2)\cos(2\theta)$ | ASTIGMATISM, SECONDARY (AXIS AT 0° OR 90°) |
| 33 | $(56R^8 - 105R^6 + 60R^4 - 10R^2)\sin(2\theta)$ | ASTIGMATISM, SECONDARY (AXIS at $\pm 45°$) |
| 34 | $(126R^9 - 280R^7 + 210R^5 - 60R^3 + 5R)\cos\theta$ | COMA, SECONDARY (x-AXIS) |
| 35 | $(126R^9 - 280R^7 + 210R^5 - 60R^3 + 5R)\sin\theta$ | COMA, SECONDARY (y-AXIS) |
| 36 | $252R^{10} - 630R^8 + 560R^6 - 210R^4 + 30R^2 - 1$ | SPHERICAL ABERRATION, QUATERNARY |
| 37 | $924R^{12} - 2772R^{10} + 3150R^8 - 1680R^6 + 420R^4 - 42R^2 + 1$ | SPHERICAL ABERRATION, QUINTERNARY |

FIG. 7B

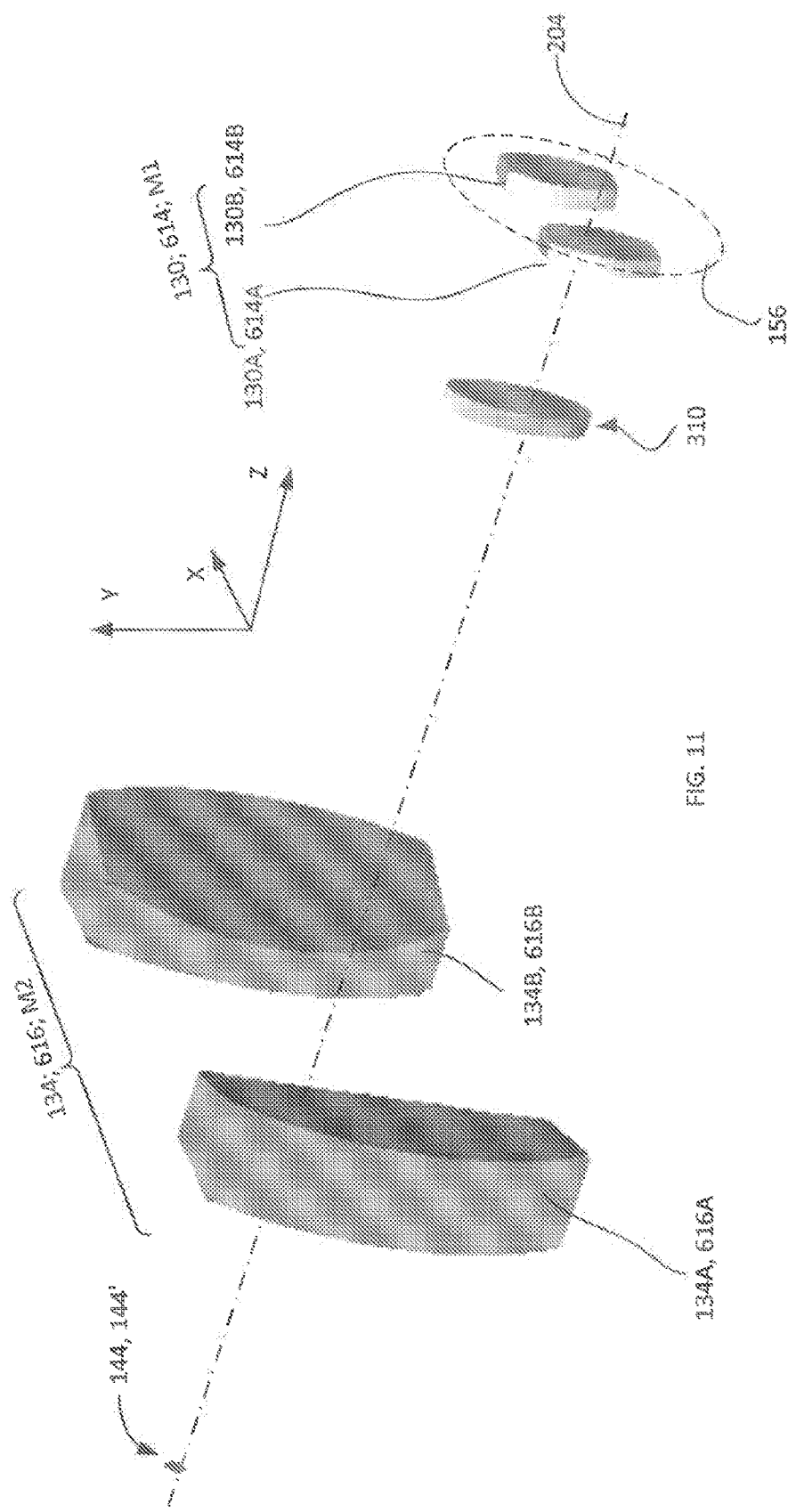

The SPS QBF surface is defined by a series of Qbfs polynomials up to the 30th-order. This set of polynomials defines an axially symmetric asphere added to a base best-fit sphere, and is appropriate for use with "mild" aspheres. The equation used is:

$$z = \frac{c_{bfs} r^2}{1 + \sqrt{1 - c_{bfs}^2 r^2}} + \frac{u^2(1-u^2)}{\sqrt{1 - c_{bfs}^2 r_n^2 u^2}} \sum_{m=0}^{13} a_m Q_m^{bfs}(u^2)$$

where

| | |
|---|---|
| $z$ | is the sag of the surface parallel to the z-axis (in lens units) |
| $c_{bfs}$ | is the curvature of the best-fit sphere |
| $r = \sqrt{x^2 + y^2}$ | is the radial distance |
| $r_n$ | is the normalization radius (NRADIUS) |
| $u$ | is $r/r_n$ |
| $a_m$ | is the $m^{th}$ Qbfs coefficient |
| $Q_m^{bfs}$ | is the $m^{th}$ Qbfs polynomial |

FIG. 13

Values of fringe Zernike coefficients, in milliwaves, for the PO design shown.

| Coefficient | Field center |
|---|---|
| Z2 | 0 |
| Z3 | 0 |
| Z4 | 0.0092 |
| Z5 | 0 |
| Z6 | 0 |
| Z7 | 0 |
| Z8 | 0 |
| Z9 | -0.1458 |
| Z10 | 0 |
| Z11 | 0 |
| Z12 | 0 |
| Z13 | 0 |
| Z14 | 0 |
| Z15 | 0 |
| Z16 | 0.0042 |
| Z17 | 0 |
| Z18 | 0 |
| Z19 | 0 |
| Z20 | 0 |
| Z21 | 0 |
| Z22 | -0.0001 |
| Z23 | 0 |
| Z24 | 0 |
| Z25 | -0.0025 |
| Z26 | 0 |
| Z27 | 0 |
| Z28 | 0 |
| Z29 | 0 |
| Z30 | 0 |
| Z31 | 0 |
| Z32 | 0 |
| Z33 | 0 |
| Z34 | 0 |
| Z35 | 0 |
| Z36 | 0.0045 |
| Z49 | 0.0059 |

FIG. 18B

OPTICAL OBJECTIVE FOR OPERATION IN EUV SPECTRAL REGION

CROSS-REFERENCE TO RELATED APPLICATIONS

This application is a continuation of International Application No. PCT/US2018/027785, filed Apr. 16, 2018, which claims priority from and benefit of U.S. Provisional Patent Application Nos. 62/487,245, filed on Apr. 19, 2017; 62/490,313, filed on Apr. 26, 2017; and 62/504,908 filed on May 11, 2017. International Application No. PCT/US2018/027785 also claims priority from and benefit of U.S. patent application Ser. No. 15/599,148, filed on May 18, 2017; and Ser. No. 15/599,197, filed on May 18, 2017. The disclosure of each of the above-mentioned applications is incorporated by reference herein.

TECHNICAL FIELD

The present invention relates to objectives configured to operate in an ultraviolet portion of the optical spectrum and, more particularly, to a Schwarzschild-type optics judiciously dimensioned to form an optical image of a spatially-dense pattern of substantially one-dimensional indicia that is disposed on either a curved surface or a planar surface.

BACKGROUND

Currently commercially-available EUV lithographic equipment (referred to hereinafter as general-purpose EUV systems) is structured to image a reticle mask, which carries an arbitrary two-dimensional (2D) pattern(s) thereon, onto a rectangular field of a workpiece (such as a workpiece, or substrate, which is a specific case can be represented by a semiconductor wafer). Owing to the 2D nature of such pattern that has to be optically transferred from the reticle and imaged onto the workpiece, a general-purpose EUV system is necessarily implemented as a scanning system to provide for and enable a relative displacement between the workpiece and the reticle. Currently, such implementation is achieved with the use of one moving stage for the reticle and at least one more moving stage for the workpiece, without which a transfer of all features of the reticle pattern onto the workpiece with sufficient accuracy and resolution is rather complicated and, in practice, not realized as desired. Structural and operational complexity of the currently-used general-purpose EUV system inevitably and substantially increases the operational cost of the system, and reduces the number of exposures of the workpiece per unit of time, in part because the transmission of EUV light through an optical system is limited. Moreover, since the transfer of the pattern onto the workpiece requires a process of optical imaging in two dimensions, a train of optical components of an existing general-purpose EUV system requires and is characterized by a high degree of complexity. For example, such train may include;—six polished mirrors in the projection portion (or projection optics) of the optical train, with mirror-surface roughness of less than 0.1 nm runs and mirror alignment tolerances of less than 1 nm or so;—a structurally complicated and tunable illumination portion (illumination unit) of the optical train; and—large reticles or masks with complex reflective coatings. In addition, the properly implemented pattern transfer requires the use of complex combinations of alignment marks. All these inevitably lead to high costs of design and fabrication of a general-purpose EUV system.

SUMMARY

Embodiments provide a catoptric system having a reference axis and including first, second, and third reflectors. The first reflector contains a pattern-source. A combination of the second and third reflectors is configured to form an optical image with a reduction factor N>1 in extreme UV light. Such image is an image of a substantially one-dimensional (1D) pattern of the pattern-source and is formed with only two beams of light that have originated at the first reflector as a result of irradiation of the first reflector with a beam of light incident upon it. The optical image is formed in a plane that is optically-conjugate to the first reflector. These only two beams of light do not include a beam of light that represents a specular reflection of the incident beam of light irradiating the first reflector.

For example, embodiments present an optical imaging system having an optical axis and including (i) a convex reflector unit defining a first opening in such reflector; and (ii) a concave reflector unit defining a second opening in such reflector. The imaging system is configured (a) to receive, at a surface of a convex reflector unit, optical radiation in a form of two beams of radiation delivered thereto through the second opening, and (b) to form an image of an object by irradiating an image plane with said optical radiation after said optical radiation has been reflected from a surface of the concave reflector unit and after said optical radiation has passed through the first opening. The imaging system may be configured as a projection optical system of a lithographic exposure tool.

In one specific case, at least one of the convex reflector unit and the concave reflector unit includes first and second reflecting elements separated by a gap, said gap representing a corresponding of the first and second openings, the optical axis passing through said gap. Alternatively or in addition, at least one of the surface of the concave reflector unit and the surface of the convex reflector unit is congruent with a portion of a rotationally-symmetric surface.

In one embodiment the system is configured such that the two beams of radiation are the only two beams of radiation received at the surface of the concave reflector unit and used to form the image. In a specific case of such embodiment, the optical imaging system is configured to from the image by using these only two beams of radiation each of which carries radiation that has diffracted on a substantially one-dimensional (1D) structure associated with the object. In particular, the substantially one-dimensional structure may be formatted as a 1D diffraction grating disposed on a flat surface or on a spatially-curved surface.

In one implementation of the optical imaging system, at least one of the following conditions is satisfied: (i) a value of a first ratio is between about 8.5 and about 60; the first ratio defined as a ratio of a separation between the primary and secondary mirrors to a working distance of the system; and (ii) a value of a second ratio is between about 0.2 and about 1.0, the second ratio defined as a ratio of the separation between the primary and secondary mirrors to a total track length of the system. In the case of either condition, an entrance pupil of the system is separated from a reticle of the system by a distance from about 1.5 m to about 1.8 m. In related embodiment, at least one of the following conditions is satisfied: i) a value of a first ratio is between about 9.5 and about 14.5, the first ratio defined as a ratio of a separation between the primary and secondary mirrors to a working distance of the system); and ii) a value of a second ratio is between about 0.5 and about 0.7, the second ratio defined as a ratio of the separation between the primary and secondary mirrors and a total track length of the system. Here, the entrance pupil of the system is separated from a reticle of the system by a distance from about 0.3 m to about 0.7 m.

BRIEF DESCRIPTION OF THE DRAWINGS

The invention will be more fully understood by referring to the following Detailed Description of Specific Embodiments in conjunction with the not-to scale Drawings, of which:

FIGS. 5A, 5B, 5C, 5D, 5E, 5F, and 5G illustrate the sequence of the process of pupil construction, leading to the optimization of image contrast for the desired shape of the illumination pupil (the latter being dependent on the design of the IU sub-system of the 1D EUV exposure tool);

FIGS. 7A, 7B summarize Zernike polynomials associated with the design of FIG. 6;

FIG. 11 schematically illustrates a perspective view of the specific implementation of the embodiment of FIG. 6, in which both the primary and secondary reflectors are configured according to the idea of FIGS. 10A, 10B;

FIG. 13 summarizes Qbf polynomial parameters used for design of reflecting surfaces of the embodiment of FIG. 12;

FIG. 18B lists Zernike parameters of the design of projection optics (PO) of FIG. 3A;

Figure 1A:
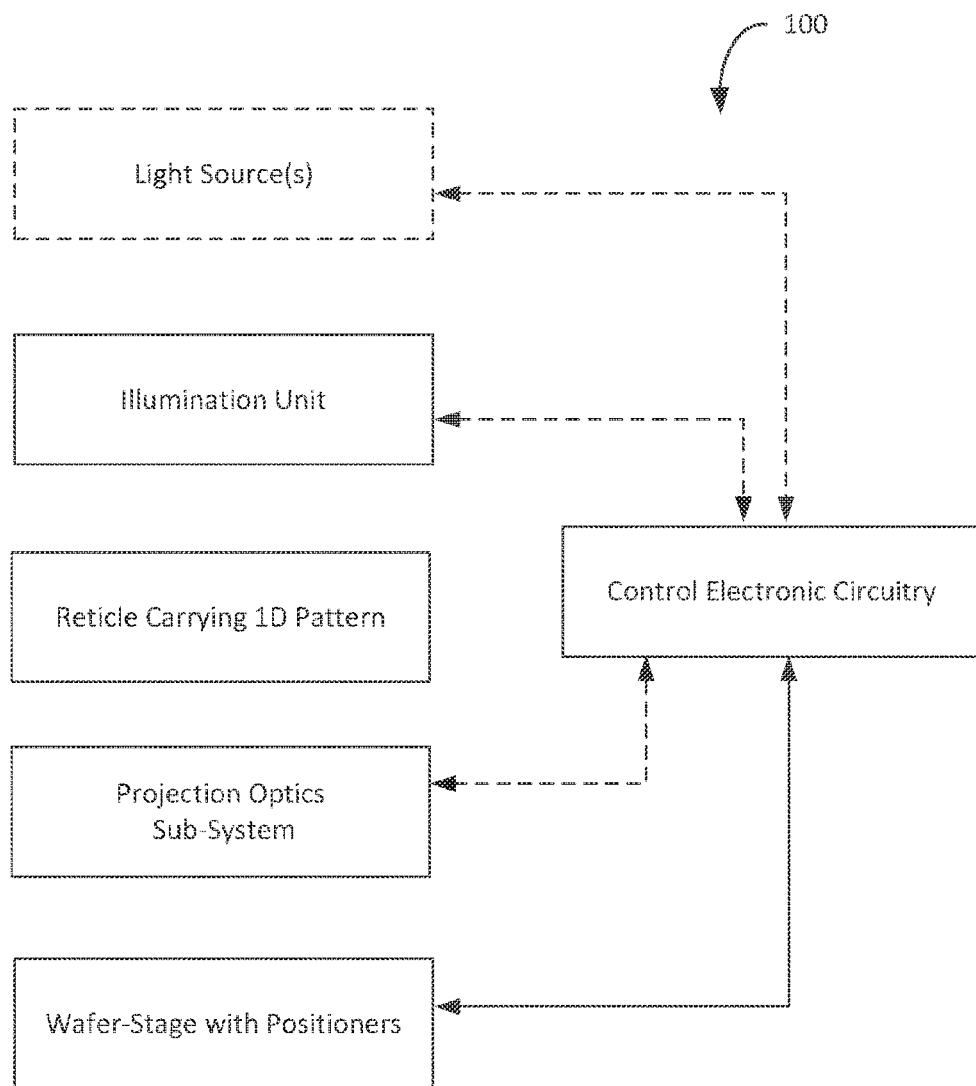
FIG. 1A provides a generalized schematic of a 1D EUV exposure tool of the embodiment.

Generally, the sizes and relative scales of elements in Drawings may be set to be different from actual ones to appropriately facilitate simplicity, clarity, and understanding of the Drawings. For the same reason, not all elements present in one Drawing may necessarily be shown in another.

DETAILED DESCRIPTION

The following disclosure addresses an optical system dimensioned as a PO for the EUV exposure tool and associated method(s) configured for lithographically-marking a chosen general workpiece (in one case—a substrate or a wafer and, in a specific case—a substrate already carrying a spatially-distorted pattern; all these terms used interchangeably) with a new one-dimensional pattern containing spatially-densely packed or formed parallel lines.

As used herein, and unless specified otherwise, the term "one-dimensional pattern" (or, "1D pattern") refers to a geometric pattern which is defined at a surface (in case of a lithographic application—such as a photomask or reticle, in order to be transferred with the methods of photolithography to a light-sensitive photoresist on the substrate of choice, such as semiconductor wafer, to create an image of such 1D pattern) and generally extending across such surface along two axes that are transverse to one another. The 1D pattern may change along a first axis of the pattern while remaining substantially unchanged along the second axis (that is, the 1D pattern may be characterized by geometrical changes along the second axis the value of which generally does not exceed 50% of the changes observed along the first axis, preferably does not exceed 20%, more preferably does not exceed 10% of changes observed along the first axis, even more preferably does not exceed 5% of changes observed along the first axis, and most preferably is within 1% or less of changes observed along the first axis). An example of a 1D-pattern is provided by any collection of spaced-apart essentially identical, parallel, elongated pattern elements (such as, a combination of straight parallel lines or slits in an otherwise opaque screen defined at the photomask, for example). In a specific case the 1D-pattern at hand may form a linear (1D) grating (such as a 1D diffraction grating) characterized by periodically-changing amplitude along a first chosen axis and substantially constant amplitude along a second axis chosen to be transverse to the first axis). In the simplest case, such 1D diffraction grating is a grating having an only, single spatial-frequency. Furthermore, as will be appreciated by those skilled in the art, to correct for imaging distortion(s) caused by the optical system or deformations of the workpiece, the 1D pattern may nevertheless have small variations along first and/or second axis. For the purposes of this disclosure, an element or component containing a substantially 1D pattern (and regardless of the specific configuration of such element or component) may be interchangeably referred to as a pattern-source.

In comparison, the term "two-dimensional pattern (2D pattern)" is defined to represent a collection of pattern elements the variation or change of which is necessarily defined along both mutually transverse axes. One of the simplest examples of a 2D pattern is provided by a grid or mesh (which, when it has spatial periods defined along two transverse axes, forms a 2D grating). In reference to a pattern of a photomask of reticle as disclosed herein, the 1D and 2D patterns are considered as such regardless of the curvature of a surface of a substrate (or photomask) on which these patterns are formed. For simplicity, an EUV system (in which an embodiments of the objective discussed below is intended to be used) is specifically and purposefully structured to image 1D reticle patterns, and is referred to herein as a "1D EUV system". For simplicity and in contradistinction with the present embodiment(s), an EUV system configured to provide for imaging of a 2D-patterned reticle (such as a general-purpose EUV system) may be referred to as a "2D EUV system".

The term "optically-conjugate" and related terms are understood as being defined by the principal of optical reversibility (according to which light rays will travel along the originating path if the direction of propagation of light is reversed). Accordingly, these terms, as referring to two surfaces, are defined by two surfaces the points of which are imaged one on to another with a given optical system. If an object is moved to the point occupied by its image, then the moved object's new image will appear at the point where the object originated. The points that span optically-conjugate surfaces are referred to and defined as optically-conjugate points. A first layer or pattern is defined as being carried by (or carried on) a given surface or substrate or second layer when the first layer is directly disposed onto the given surface or substrate or second layer, or when the first layer is disposed onto an intervening third layer which, in turn, is disposed onto the given surface or substrate or second layer.

Configurations of the disclosed objective of the allow the implementation of a 1D EUV exposure tool or machine built to optically transfer dense line patterns at high resolution (which, in the case of periodic line patterns corresponds to, for example, a pitch or period of ten to twenty nanometers, preferably less than 10 nanometers, more preferably several nanometers, for example 5 nanometers or fewer) in a cost-effective way to enable 10-nanometer and 7-nanometer node semiconductor devices (defined according to International Technology Roadmap for Semiconductors, for example ITRS 2.0). The presented herein idea stems from the realization that modern, high density semiconductor chip designs are increasingly based on 1D geometrical patterns. The PO embodiment(s) disclosed here is specifically structured to optically image 1D patterns (such as patterns representing 1D gratings, in one case) from a reticle to the substrate or workpiece of interest, and possess clear structural and operational advantages over the respective POs of a general-purpose 2D EUV systems in that:

The disclosed PO is substantially structurally simplified as compared to that of a 2D EUV system and can afford to and does include fewer reflective surfaces as compared to that of a 2D EUV system, which in practice leads to and provides for good quality exposures with less optical power required from the light source (e.g. several tens of Watts, in one example as low as about 20 W).

Since the optical imaging of a 1D reticle pattern is reduced to, essentially, 1D imaging—that is, since spatial variations of an image formed on a resist carried by the workpiece exist along only one axis—the PO configured according to the present idea may be fabricated subject to more relaxed requirements on optical aberrations (as compared to those of the PO for the conventional 2D EUV system).

As a result of eliminating, from the PO of the system, of some or even many optical surfaces (as compared with that of the 2D EUV system), the scanning reticle stage, pellicle, and other elements, the cost of the proposed EUV grating machine is substantially reduced.

Schematic Examples of a Portion of the 1D EUVD Exposure Tool

Figure 1B:
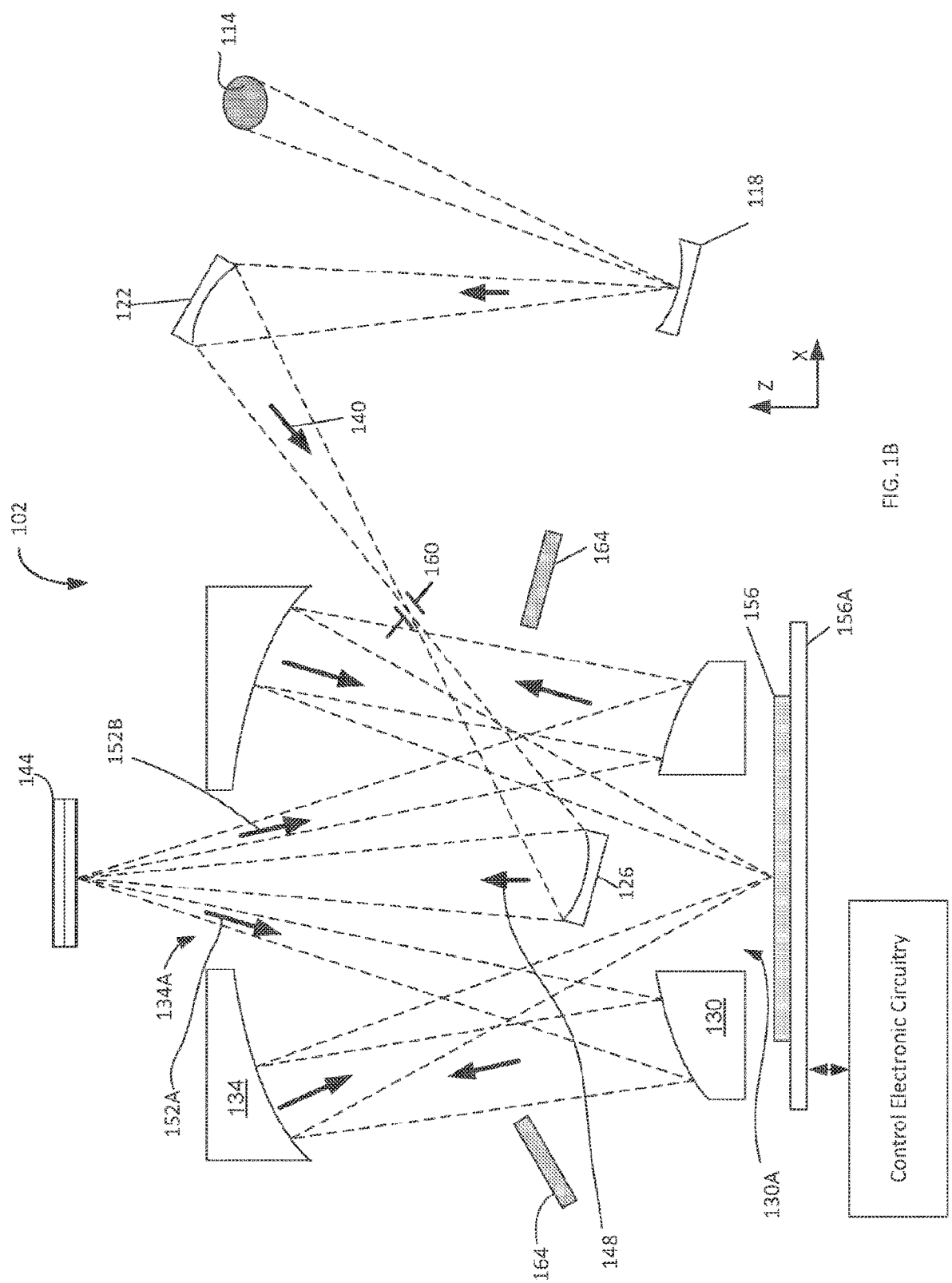
FIGS. 1B and 1C schematically illustrate related embodiments of the 1D EUV exposure tool in more detail.
Figure 1C:
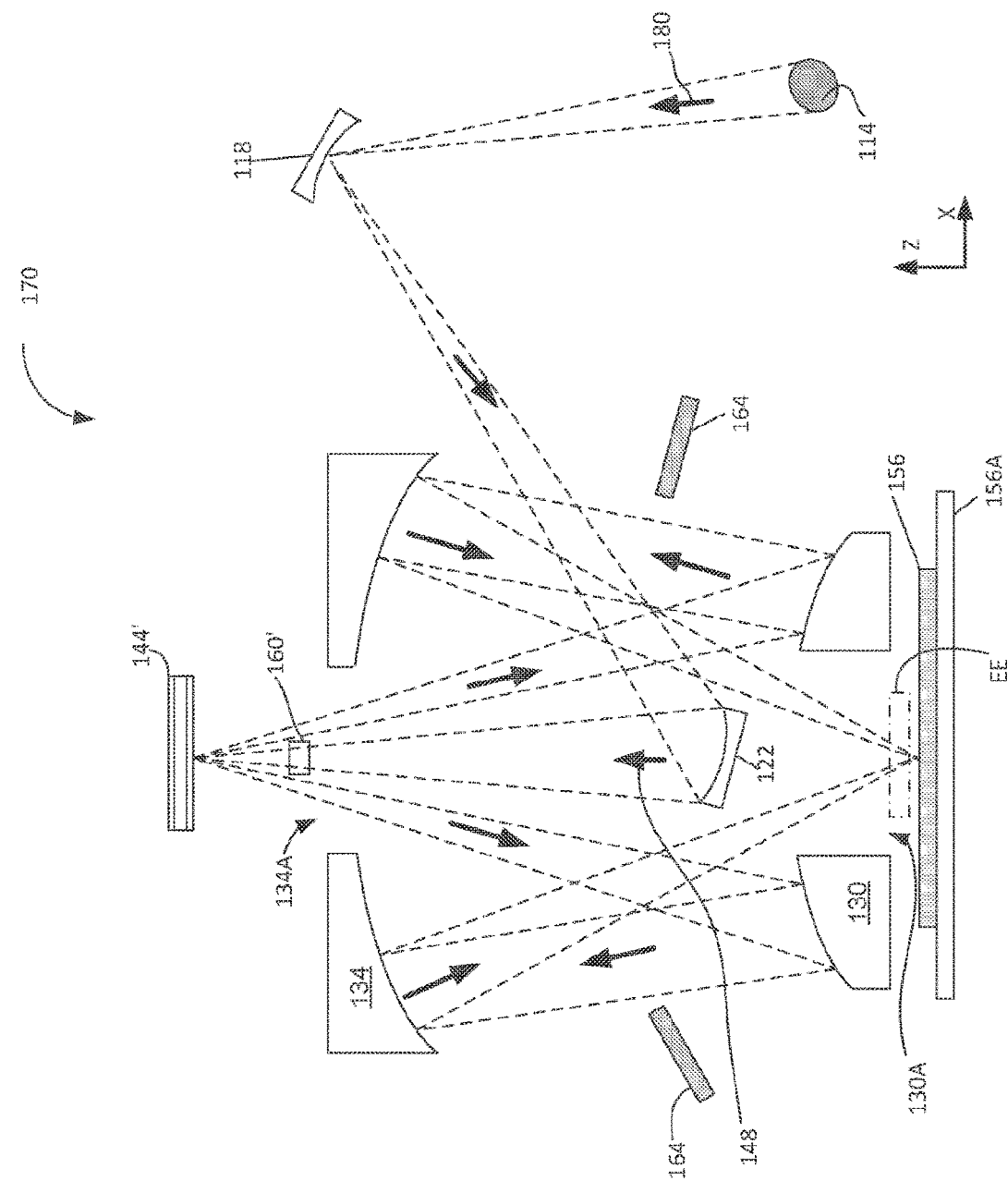

A much generalized schematic diagram of possible embodiments 102, 170 of a portion 100 of the 1D EUV system of FIG. 1A, configured according to the present idea, is shown in FIGS. 1B and 1C. The system 102, 170 may include one or more light sources (as shown—the light source 114). In the implementation 102 the system is shown to include an optical illumination sub-system or unit (IU), which contains first and second reflectors 118, 122 and a relay reflector 126; and a PO sub-system (a reflective objective) including two or more mirrors, at least one of which has an area defining an optical obscuration (a two-mirror objective of the embodiment 102 is shown to contain first and second mirrors 130, 134, each having a corresponding central obscuration 130A, 134A). The term "optical obscuration" is used herein to refer to at least a portion (of an optical element), within the bounds of which the further transfer of light incident onto an optical element to the next in line optical element is impeded, prevented, or even blocked. Examples of obscuration in a case of the reflective objective as shown are provided by (i) a through-opening in the substrate of the curved mirror (such as a curved primary mirror 130A, for example), within the bounds of which light incident onto such mirror is not reflected further toward the curved secondary mirror 130B but instead is transmitted through the through-opening, or (ii) the lack of reflective coating within the predetermined area of a mirror (substantially defining the same optical effect). The term central obscuration defines an obscuration centered at the reference axis of the optical system.

In reference to FIG. 1B, the reflector 118 collects radiation 150 emitted by the light source(s) 114 and transfers it via reflection off the reflector 122 to the relay mirror 126 as radiation 140. The system further includes a reticle 144 disposed in optical communication with the IU and PO. The reticle 144 carries a spatially-dense 1D pattern and is positioned such as to be irradiated with radiation 148 delivered from light source(s) 114 and reflected to the reticle 144 through the obscuration 134A by the relay reflector 126. As shown, the reticle 144 is a photomask operating in reflection (in a related embodiment, the reticle can optionally be configured as a transmissive reticle). It is also intended that, depending on a particular implementation of the system 100, 102, a surface of the substrate of the reticle 144 that carries the 1D pattern thereon may be spatially curved (in which case the reflective reticle has a non-zero optical power) or flat (with a substantially zero optical power).

Furthermore, the 1D pattern on the reticle may be judiciously distorted in a way appropriate to compensate for undesirable distortion of the PO. When the 1D pattern carried by the reticle is configured as an appropriately-dimensioned linear diffraction grating, the reticle 144 diffracts the incident thereon radiation 148 to form diffracted beams of light that include spatially-distinct beams 152A, 152B respectively representing diffraction orders (in one example, the +1 and −1 diffraction orders) and propagating towards the mirror 130 of the PO (the zeroth order of diffraction may be appropriately blocked from so propagating). In combination, the first and second reflectors 130, 134 of the PO redirect the diffracted beams through the obscuration 130A onto the workpiece or substrate of interest 156 to expose at least one layer of photoresist carried thereon with an image of the 1D pattern of the reticle 144.

It is appreciated that, according to the present idea, the reticle is disposed in a substantially fixed spatial and optical relationship with respect to the IU and PO sub-system in that both position and orientation of the reticle, once chosen and defined inside the 1D EUV exposure tool, are fixed (except for small adjustments that may be required to maintain focus and alignment. The term "substantially fixed relationship" refers to and defines the situation when a position of the reticle, the mechanical support of which is devoid of a structure configured to scan the reticle in a motion synchronized with a motion of the wafer-stage during operation of the exposure tool, may be, nevertheless, subject to small adjustments the magnitude(s) of which are sufficient to correct for errors in any of focus, magnification, and alignment during the operation of the exposure tool.

The system 100, 102 may also include, in some implementations, a fixed-in-size or variable aperture 160 (for example, a variable slit of a particular shape; interchangeably referred to as "pattern blind" or "blind field stop" or simply "field stop") appropriately disposed within the IU (as shown—between the mirrors 122, 126) that may be disposed to be substantially optically-conjugate to the reticle 144, 144'; a pupil stop or aperture 164 (dimensioned to match the desired shaped of the entrance pupil of the PO); a stage/mounting unit supporting the reticle (not shown); a wafer stage 156A equipped with an appropriate stage mover (not shown) to provide for scanning of the wafer 156 with respect to the reticle 144 and the beams 152A, 152B, as required by the lithographic exposure process; and other auxiliary elements (e.g., vacuum chamber, metrology system, and temperature control system) as required. An x-axis is defined to be perpendicular to the axis along which the scanning is effectuated during the operation of the system, while y-axis is defined to be parallel to such axis of scanning. In the embodiment 102, the 1D-pattern comprises lines parallel to the Y axis.

As shown in the general schematic 100 of FIG. 1A, the system further includes a control unit (control electronic circuitry), optionally equipped with a programmable processor and configured to govern the operation of at least the wafer-stage and, in some embodiments, of at least one of the light source(s), IU, and PO sub-system.

FIG. 1C schematically illustrates an embodiment 170 of the 1D EUV system 100, in which—as compared to the embodiment 102 of FIG. 1B—the relay mirror 126 has been removed. When the reticle 144' is structured to operate in reflection, the reticle 144' images the reflector 122 into the entrance pupil of the PO sub-system. Upon transmission from the light source(s) 114, a beam of radiation 180 traverses the field stop 160' that is disposed in close proximity to the reticle 144' (as shown) or, alternatively, in close proximity to the wafer 156 across a beam of radiation that was diffracted by the reticle-pattern towards the PO sub-system (as shown schematically with the dashed line EE). The proximity distance separating the field stop 160' (when the field stop is present), from the reticle is, generally, shorter than 3 mm, preferably shorter than 1 mm, more preferably shorter than 100 microns, and even more preferably shorter than 50 microns.

Figure 19A:
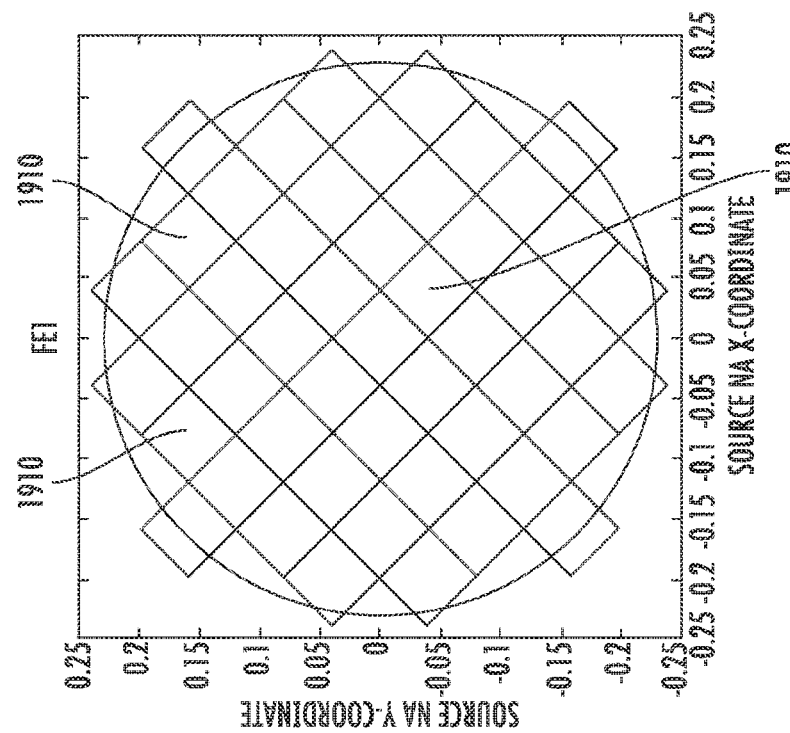
FIGS. 19A, 19B show, in front view, schematic diagrams of reflectors of the illumination unit of an embodiment of the 1D EUV system.
Figure 19B:
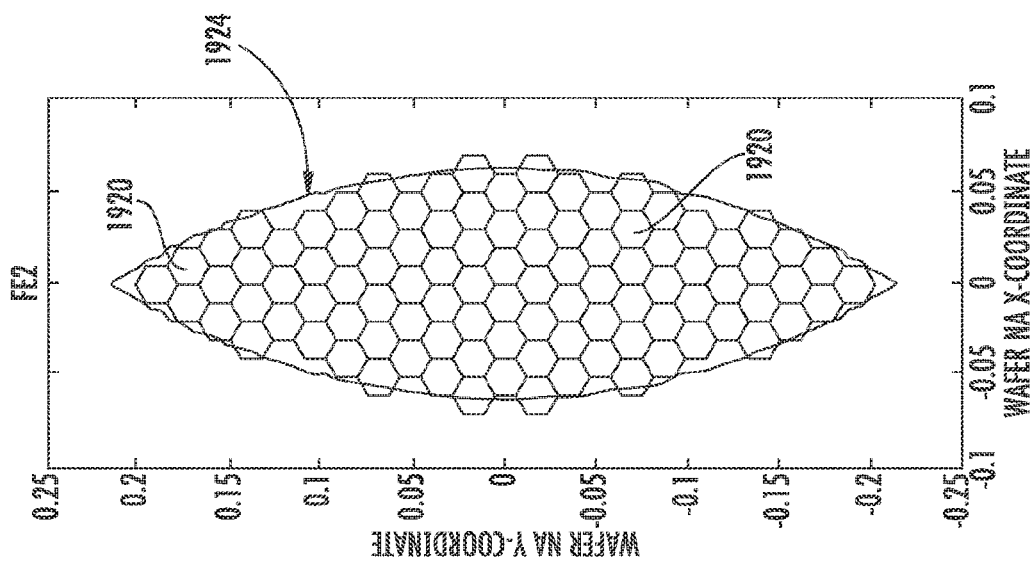

It is appreciated that the specific design of the PO portion of the 1D EUV system of in one embodiment should take into account the fact that reflectors of the IU portion of the 1DEUV system can be configured as "fly's eye" arrays. For example, reflector 118 can be configured as a "fly's eye" reflector array FE1, to contain individual reflector elements 1910 that may have corresponding diamond-shaped perimeters, as is schematically shown in FIG. 19A. Reflector 122 can be configured as a "fly's eye" reflector array FE2, shown in FIG. 19B, configured from tiles formed by reflector elements 220 (having hexagonal or circular perimeters) to define a leaf-shaped aperture 1924 and conserve etendue.

If this is the case, each of 118, 122 reflector arrays is configured to capture and reflect radiant energy acquired from a respectively corresponding radiant object with the use of a respectively-corresponding two-dimensional array of mirrors (alternatively referred to as "facets" or "eyes"). Such array of mirrors or facets may be referred to as a "fly's eye reflector" (or even a "fly's eye lens", as is sometimes done in the art) normally without the aid of an additional larger viewing lens and/or reflector. In reference to FIG. 1C, for example, light from light source 114 is captured by reflector (118, FE1); light reflected by (118, FE1) is captured by the reflector array (122, FE2). Each individual mirror element of the reflector array forms an image of the radiant object as seen from the viewpoint of that individual mirror element's location.

Generally, the PO sub-system of the 1D EUV system of embodiments includes an anastigmatic two-mirror system configured as a Schwarzschild-type objective to provide optical imaging of the 1D pattern from the pattern-source (144, 144') onto the workpiece 156 with a de-magnification (or size-reduction coefficient, or reduction ratio) of r, and numerical aperture NA=0.4. In one implementation, the area exposed on the workpiece 156 has a diamond shape (for example, 16.5 mm extent in the X-direction, which is normal to the direction of scanning of the workpiece in the exposure tool, by 5 mm extent in the Y direction, which is parallel to the imaged lined of the 1D pattern lines and the direction of the wafer stage scanning motion). The chosen shape of such diamond-shaped exposure field is appropriate for stitching of immediately adjacent fields. Generally, the optical aberrations within such exposure field are about 12 milliwaves or less, in the case of the on-axis illumination. For the purposes of this disclosure, the term "on-axis illumination" is a short hand notation for illumination where (i) the illumination propagates, on average, parallel to the optical axis and/or the direction of propagation of illumination includes the direction parallel to the optical axis (precluding dipole or annular illumination where the axial direction is absent), (ii) the position of illumination is centered on the point where the optical axis pierces the object plane.

Figure 2:
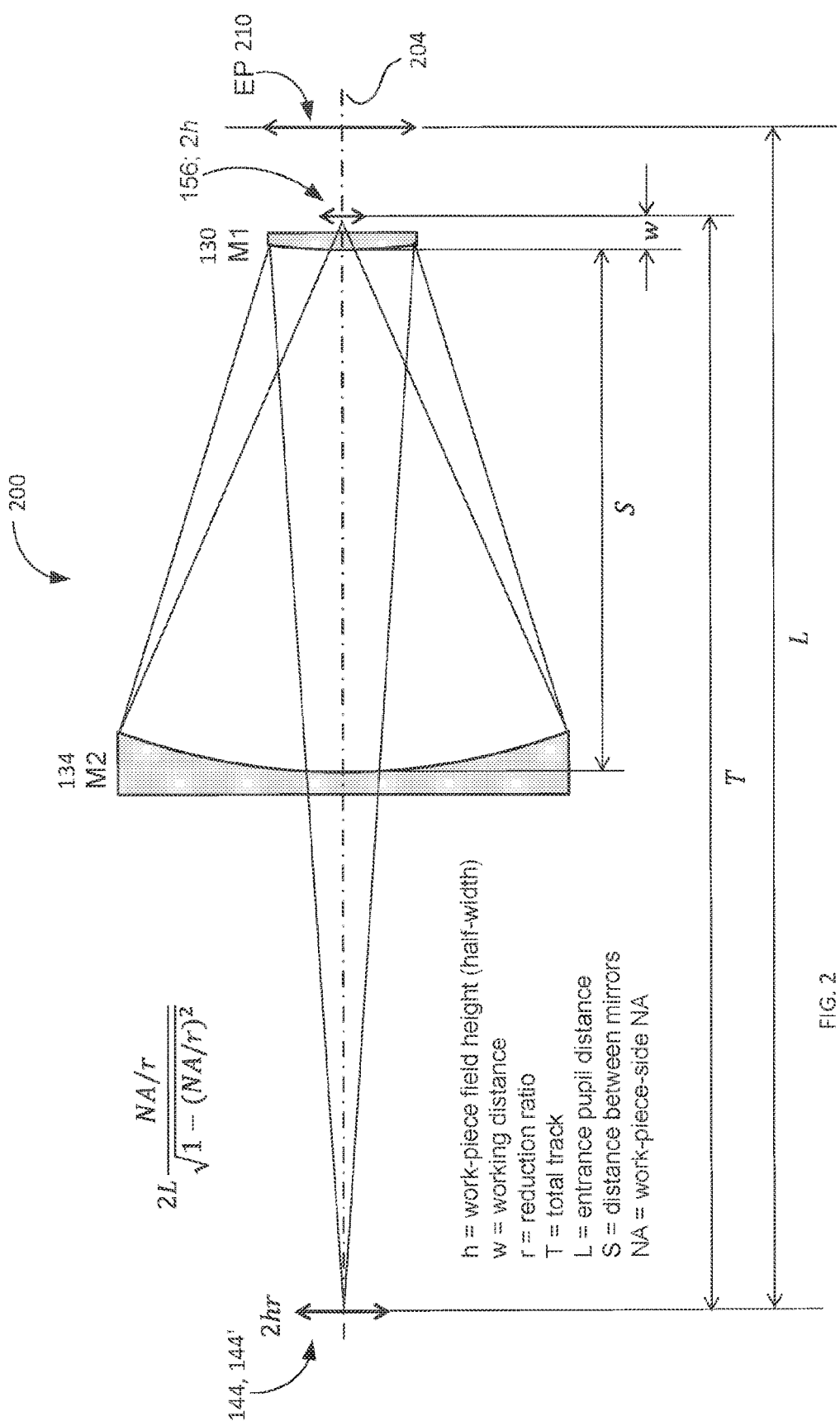
FIG. 2 is a schematic diagram of an embodiment of the PO sub-system of the 1D exposure tool with indicia of terms and nomenclature.

In reference to FIG. 2, which provides illustration to used terminology and nomenclature, the embodiment 200 of the PO sub-system is shown (for simplicity of illustration—without central obscurations in any of the primary mirror (M1,130) and the secondary mirror (M2,134) in relation to the pattern-source (144, 144') and the workpiece/wafer 156. The reference axis—in this case, the optical axis—is denoted as 204. Here, the full extent of the 1D pattern on the pattern-source (144, 144') is 2 hr, while the full extent of the image of such pattern-source (formed on the workpiece 156 with the reduction ratio of r) is 2 h; "total track" T is the distance between the pattern source 144, 144' and the workpiece 156; L is the distance separating the entrance pupil (EP, 210) of the PO sub-system from the reticle 144, 144'; S is the separation between the vertex of the convex surface of the primary mirror 130 and the vertex of the concave surface of the secondary mirror 134; w is the working distance, defined by the separation between the vertex of the surface of the primary mirror 130 and the workpiece-surface that is facing the PO sub-system. Each of the reticle, EP, and the workpiece are illustrated with vertical double-arrowed lines.

Figure 3:
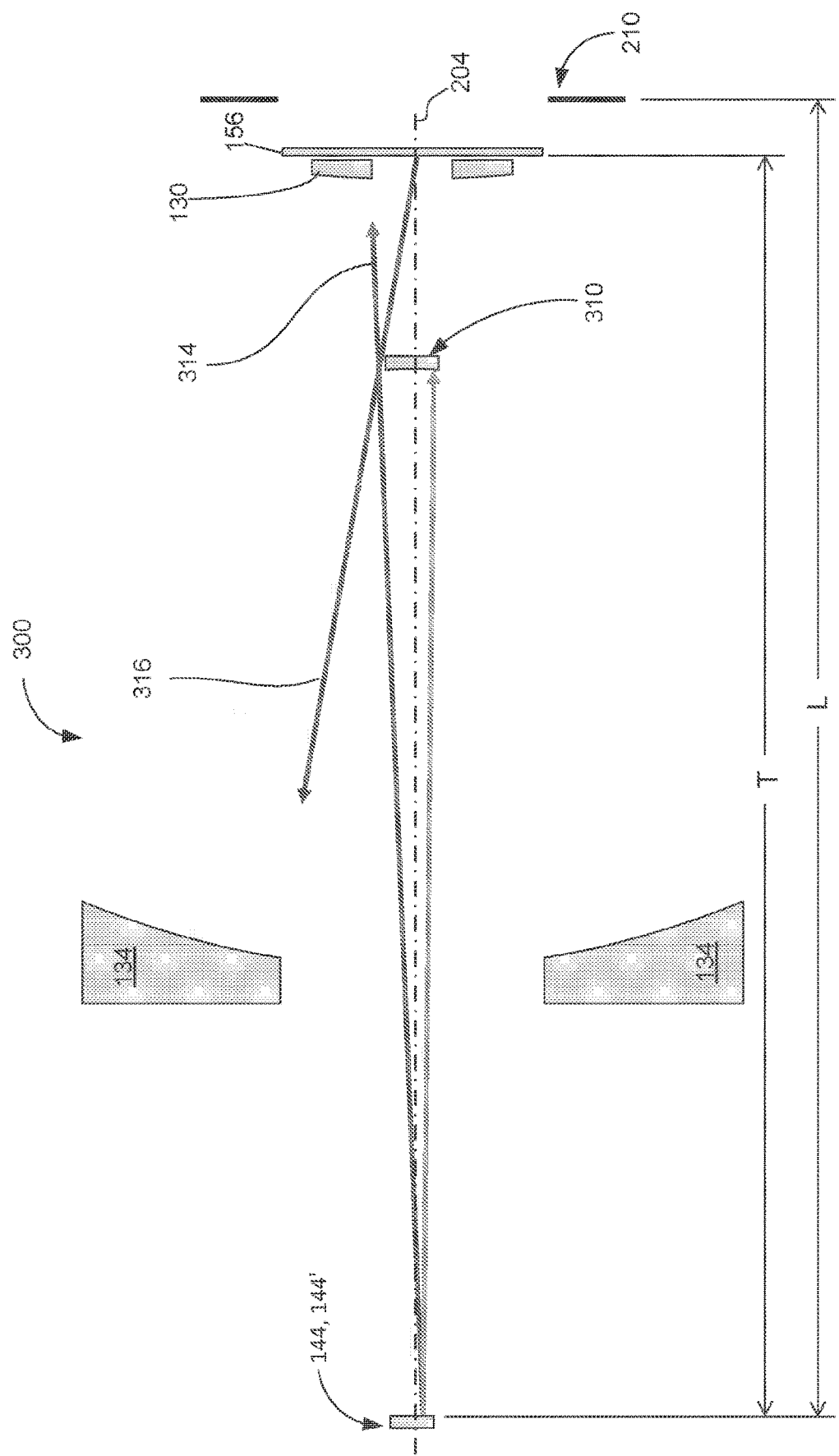
FIG. 3 is a schematic diagram of an embodiment of the PO sub-system showing central obscurations in constituent components of the embodiment.

FIG. 3 illustrates the same embodiment as that of FIG. 2 (this time denoted as embodiment 300) while at the same time schematically showing both the central obscurations in the mirror elements 130, 134 and an on-axis-located optical element 310 (which may be a reflector such as the element 126 of FIG. 1B or 122 of FIG. 1C, for example). The size of the optical element understandably affects the geometrical dimensions of the embodiment 300, and vice versa. A person of skill in the art will also readily appreciate that geometrical parameters of the pattern-source (144, 144') affect the spatial extent of the PO sub-system. For example, the higher the radius of curvature of the pattern-carrying surface of the pattern-source 144, 144' is (flat pattern-source has a substantially zero value of curvature), the larger the total track length T becomes. It is also understood, that the field-of-view (FOV) of the PO sub-system scales or changes with the total track length T and the reduction ratio r. The space available for placing the optical element 310 such that it does not truncate or block any of the image-forming rays 314, 316 (the edge rays of, respectively, a bundle of rays projected from the 1D pattern of the pattern-source 144, 144' to a corresponding portion of the primary mirror 130) relate to the spatial coordination of a bundle of rays projected from the secondary mirror 134 to the workpiece 156 through the optical obscuration area of the primary mirror 130. It was empirically discovered that such spatial positioning/coordination is entirely dependent on a few parameters, and not at all on the surface prescriptions of the two mirrors 130,134. These parameters that have to be considered include (1) length of the system, (2) field of view, (3) reduction ratio, (4) range of pitches (1D pattern and/or image of it), (5) numerical aperture, and (6) distance between the reticle and the entrance pupil of the PO sub-system.

Figure 4:
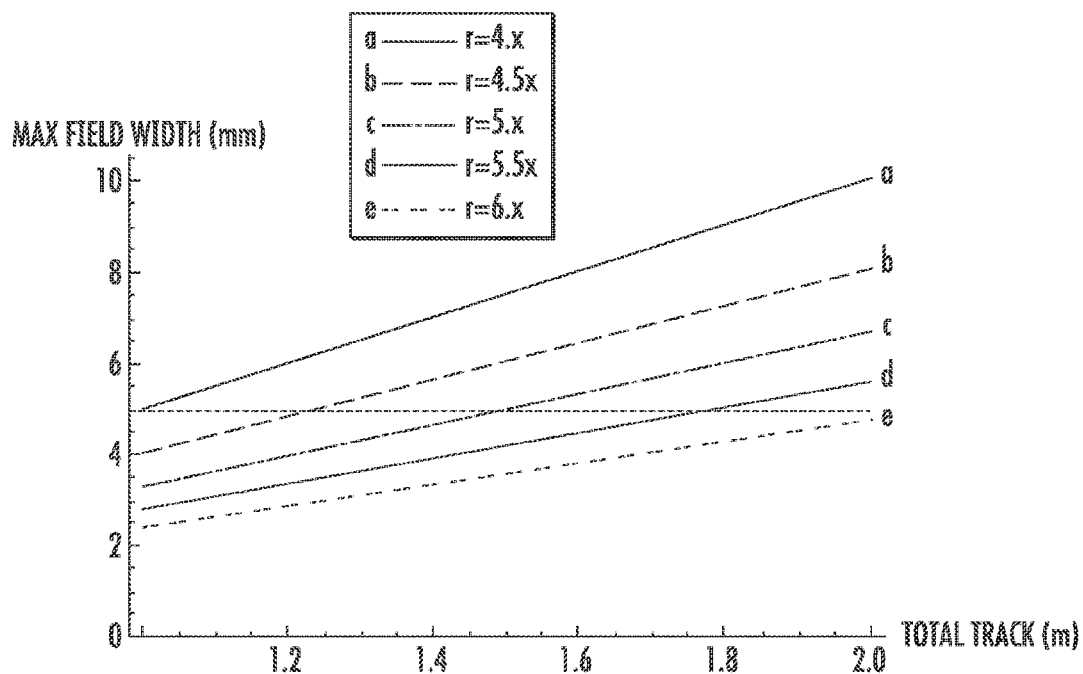
FIG. 4 contains plots illustrating dependencies of the maximum imaging field widths as a function of the total length of the embodiment of the PO sub-system for various demagnification (reduction) values or ratios.

It was empirically determined that an r=5 system (that is, a 5×-reduction system) provided a good tradeoff between the field of view and the system length, T, the practical limit on which was set at about 1.5 m. (The preferred range of reduction coefficients is from about 4 to about 6, as further discussed below.) The plots of FIG. 4 illustrate how the FOV scales with the track length T and the reduction ratio r. The dashed line in FIG. 4 indicates the preferred field size, which was chosen based on throughput calculations showing that smaller fields caused the throughput to become workpiece-stage acceleration limited. To appreciate these and other interdependencies among the parameters of the PO sub-system, one can undertake a process of pupil construction, discussed in short below.

Pupil Construction

FIGS. 5A through 5G illustrate the example of a process of pupil construction for the disclosed optical system of the 1D EUVD exposure tool. The purpose of this process is to define the opto-geometrical parameters of the PO sub-system of the embodiment that facilitates optimization (increase) of contrast of imaging of the substantially 1D pattern, located between the IU of the exposure tool and its PO sub-system, on the chosen workpiece. To this end, an image is formed as a result of a 2-beam interference (optical interference between the +1 and −1 orders of diffraction formed from light incident onto the substantially 1D pattern of the pattern-source 144, 144' such as, for example, a 1D diffraction grating, through the IU of the exposure tool) on the image plane while imaging such 1D pattern onto the image plane (where the workpiece 156 is placed). The zero order of diffraction is minimized by the appropriate design of the 1D diffraction grating and/or blocked with an opaque component (such as the element 160') in another implementation. Since the etendue of the source 114 of UV light is much smaller than the required illumination/imaging etendue, it is possible to construct an illumination pupil the area of which (the solid angle of which) is maximized for 100% contrast. This should result in wider margins of the process of manufacturing of the patterned workpiece 156.

Figure 5A:
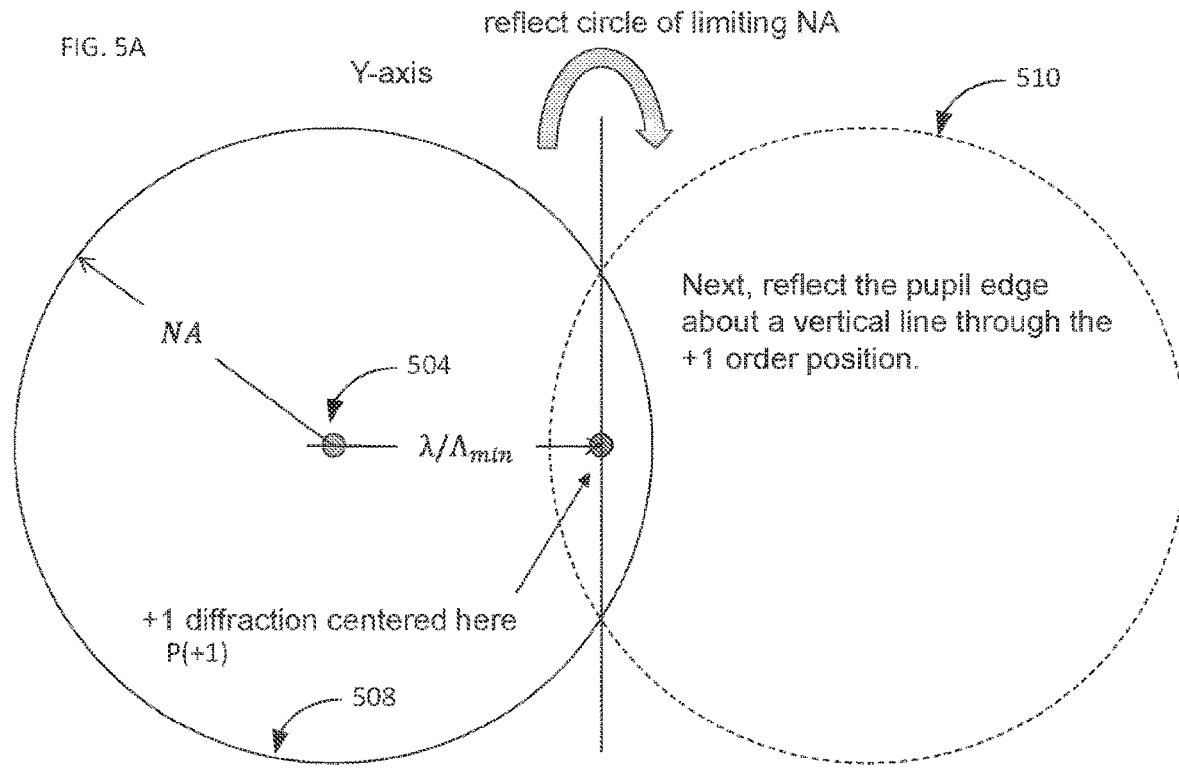
Figure 5B:
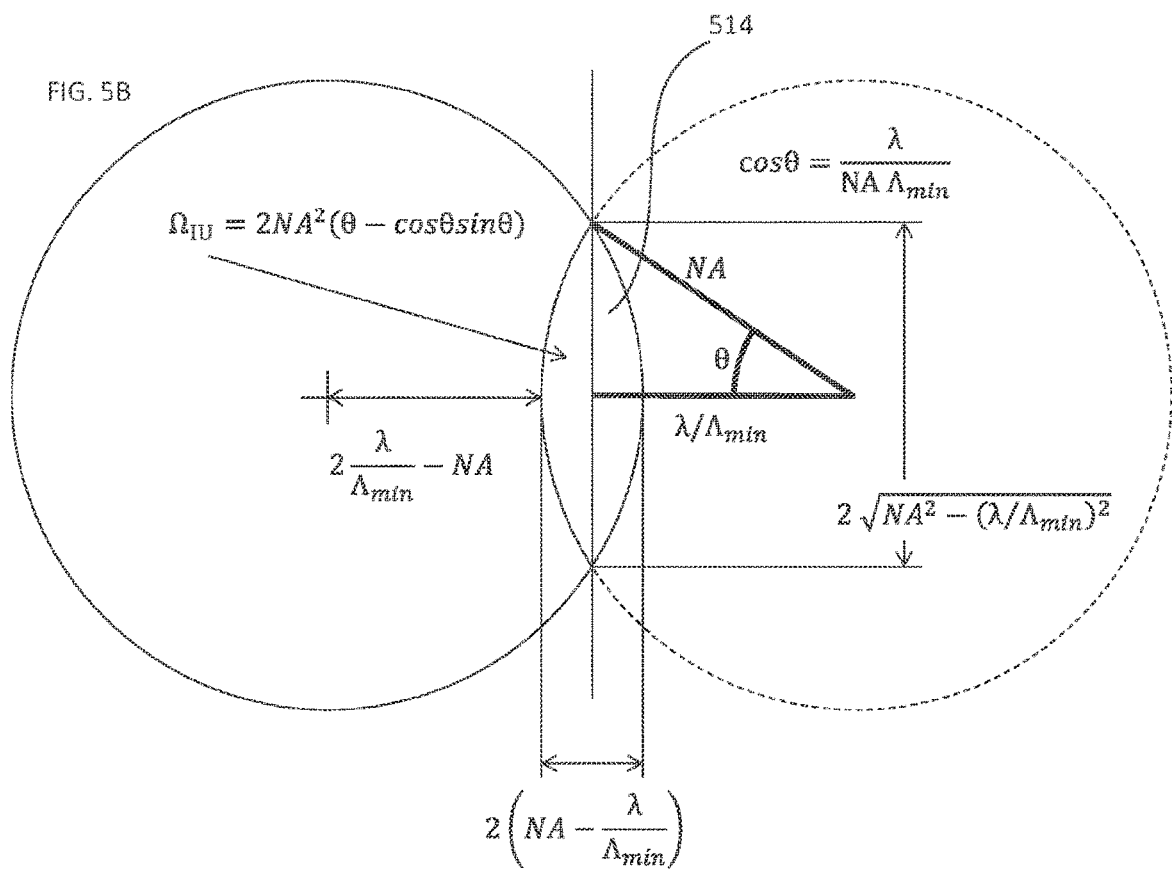
Figure 5F:
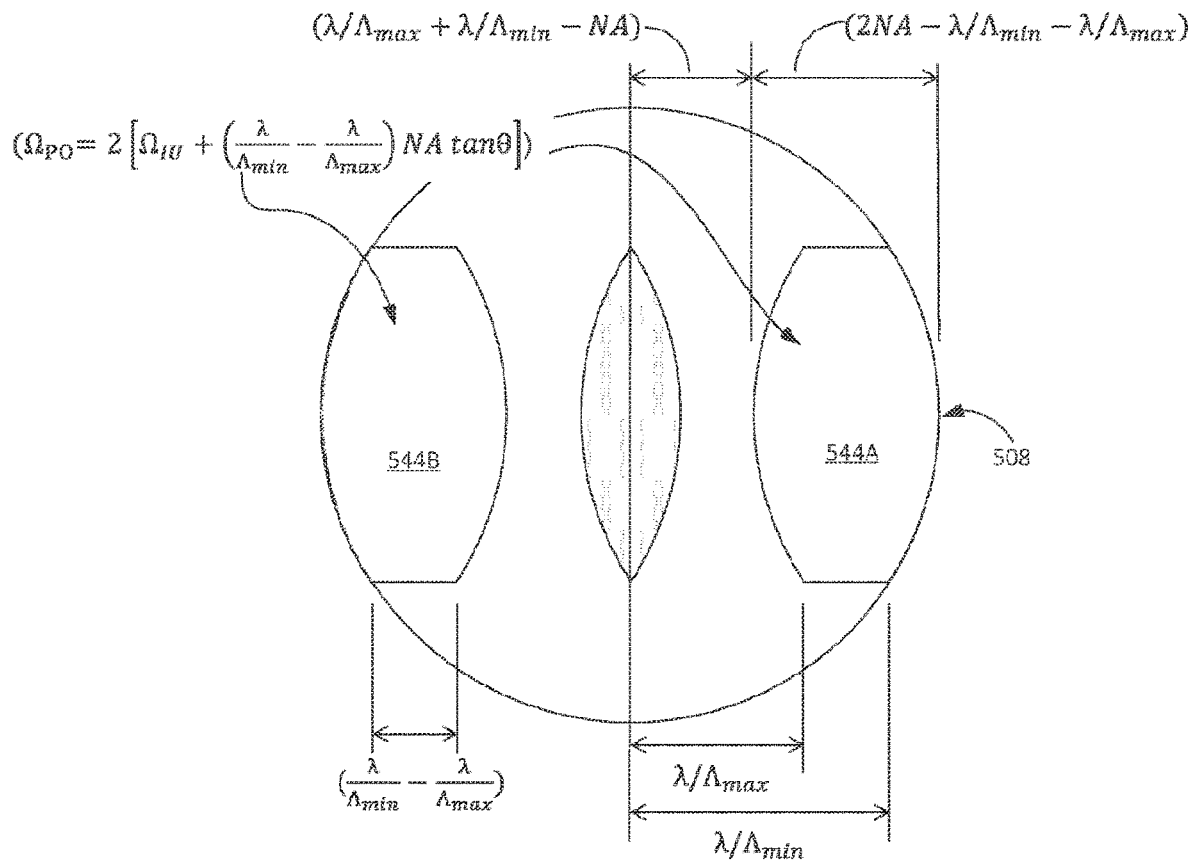

In reference to FIGS. 5A and 5B, the construction starts with an assumption of coherent on-axis illumination of the 1D (single-frequency) diffraction grating. Here, beam 504 illuminating the 1D diffraction grating of the element 144, 144' is shown on axis (as viewed along the reference axis 204). Then the +1 diffraction order beam, formed at the grating (for a grating pitch of $\Lambda_{min}$) appears at a point P(+1) that is separate by the distance $\lambda/\Lambda_{min}$ from the center of the pupil or reference axis. The pupil construction process proceeds by "reflecting" a circle 508, drawn with a radius equal to the numerical aperture NA desired in the image space (that is, in the space of a workpiece, onto which the 1D diffraction grating is imaged from the element 144, 144' by the PO sub-system) about a line passing through the point P(+1) to obtain the boundary line 510, shown in FIG. 5A with a dashed line. The ideal shape of the illumination filed—that is the spatial distribution light delivered to the element 144, 144' through the IU of the 1D EUV exposure tool—that maximizes $\Omega_{IU}$ and image contrast, is then presented by the region of overlap of the two circles 508, 510. This area 514, outlined by the overlap between the circles 508, 510 represents $\Omega_{IU}$ and corresponds to the illumination pupil (that is, the angular distribution of light incident onto the substrate/reticle 144 of FIG. 1 that carries the 1D pattern/1D diffraction grating). The geometrical parameters of the illumination pupil 514 with respect to the parameters of the curve 508 are specified in FIG. 5B.

In practice, not a single value but a range of values of the period of the substantially 1D pattern on the element 144, 144' may be of interest. Therefore, in addition to $\Lambda_{min}$ (which represent the minimal value of the 1D grating period of interest), the value $\Lambda_{max}$ is introduced, which refers to the maximal value of such period. (As a result of the imaging of the 1D grating from the element 144, 144' through the embodiment of the PO sub-system onto the workpiece 156, the 1D grating period value is reduced in half, as would be readily understood by a skilled person, when and if the zero-order diffraction beam is blocked from the propagation between the element 144, 144' and the workpiece through the PO sub-system.)

Figure 5G:
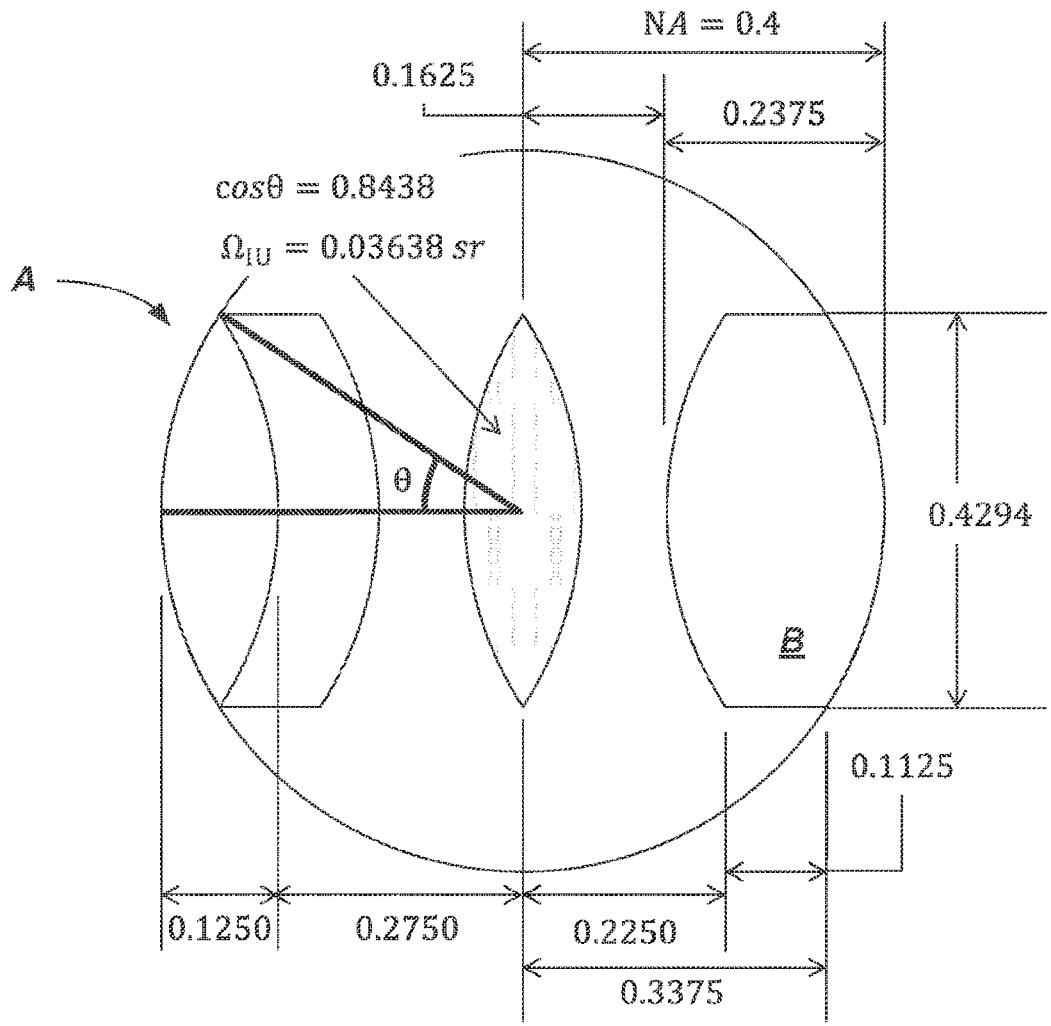

Referring now to FIGS. 5C and 5D, each illustrating the outer boundary 508 of the imaging pupil, the earlier determined leaflet-shaped illumination pupil 514 that operates as a source of light for the PO subsystem is shown to be substantially centered on reference axis 204. The imaging pupil, corresponding to imaging of the 1D grating with the period $\Lambda_{min}$ is illustrated within the boundary 508 as areas 532A, 532B for the +1 and −1 diffraction order beams, respectively. The imaging pupil corresponding to imaging of the 1D grating with the period $\Lambda_{max}$ is illustrated as areas 534A, 534B for the +1 and −1 diffraction order beams, respectively. In FIG. 5E, the boundary 540 outlines the two areas 544A, 544B of the overall, aggregate imaging pupil, configured to represent imaging of a 1D grating with any period within the inclusive range between $\Lambda_{min}$ and $\Lambda_{max}$. The same two areas 544A, 544B (shown in FIG. 5F as areas A, B) correspond to the combined solid angle $\Omega_{PO}$ subtended by the aggregate imaging pupil of the PO sub-system. FIG. 5G additionally itemizes numerical values and/or dimensions describing a specific example of the imaging pupil of the PO sub-system for the case of NA=0.4, $\lambda$=13.5 nm, $\Lambda_{max}$=60 nm and $\Lambda_{min}$=40 nm.

Following is the discussion of examples of embodiment of the PO sub-system configured for operation with the 1D EUV exposure tool to enable the imaging of the dense line pattern (such as the pattern formed by a 1D diffraction grating at the element/reticle 144, 144' with the discussed parameters $\Omega_{IU}$, $\Omega_{PO}$, $\lambda$, $\Lambda_{min}$, $\Lambda_{max}$, NA, etc. Several specific but non-limiting examples are outlined, among which there is one concerning the imaging of the substantially one-dimensional dense line pattern from the element 144, 144' the reflecting surface of which is curved, and another concerning the imaging of the pattern from the element 144,144' the reflecting surface of which is substantially planar.

PO Objective: Example 1

Figure 6:
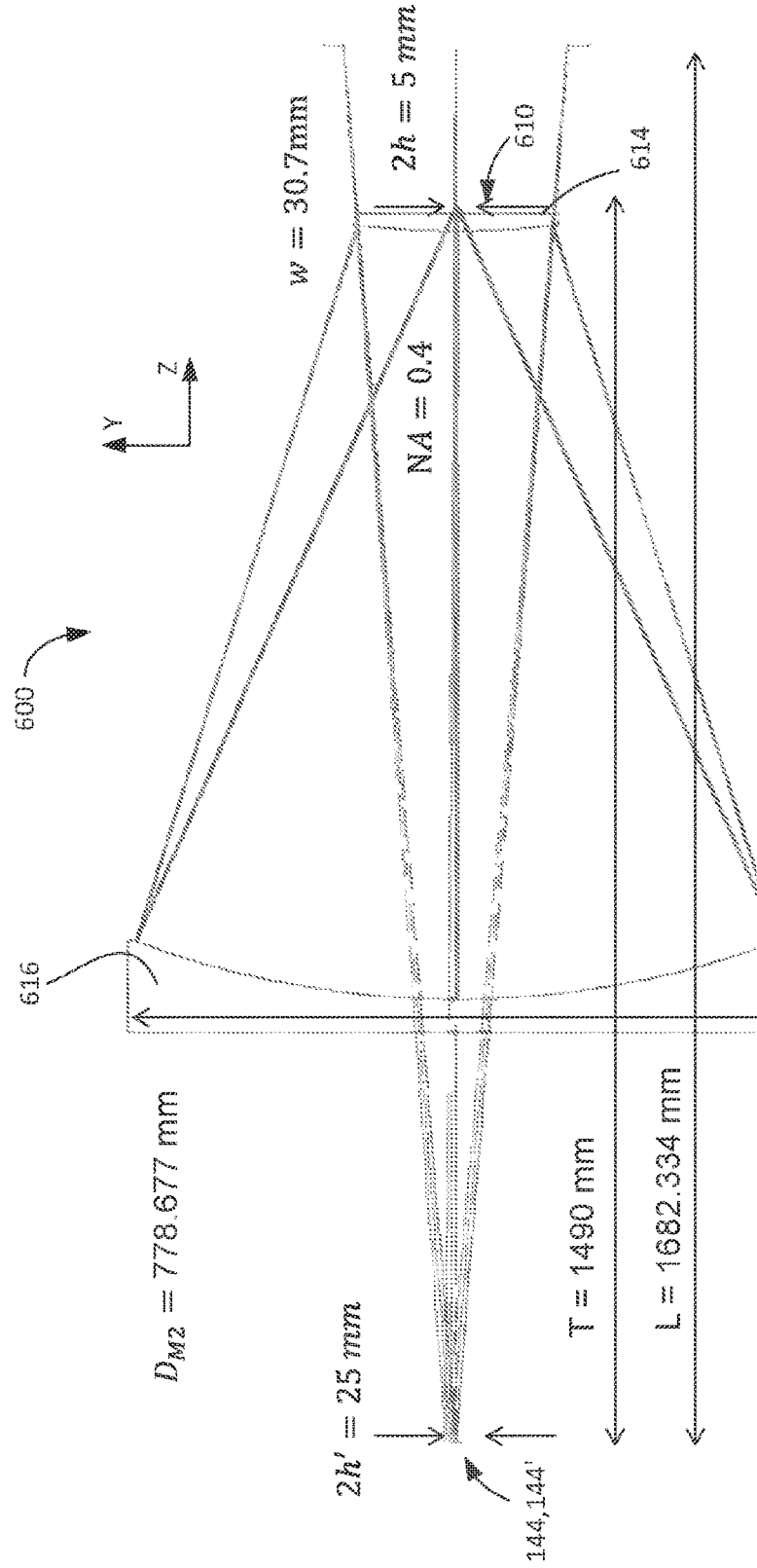
FIG. 6 provides a schematic of an embodiment of the PO sub-system configured for imaging of a dense line pattern disposed on a planar substrate.

FIG. 6 illustrates an embodiment 600 configured generally according to the Schwarzschild-type design and including a two-mirror anastigmat. As shown, the embodiment of the PO objective, configured for use with the proposed 1D EUV projection lithography system, is in operation complemented with a pattern-source 144, 144' carrying a substantially 1D mask pattern on a flat surface (in one example, a reticle is formed by defining a 1D reflective diffraction grating in association with a planar reflective surface). The PO in such embodiment is configured to include a 2-mirror, monopolar illumination sub-system (i.e., an illumination sub-system the distribution of light at any pupil plane of which comprises one "pole" or illuminated area).

Table 1 summarizes the parameters of the optical components of the objective configured to image the 1D pattern-carrying reticle (denoted as "grating") onto the workpiece (denoted in Table 1 as a "wafer").

In one specific implementation shown in FIG. 6, for example, the 1D EUV system includes an anastigmatic projection-optic two-mirror system 600 configured to provide optical imaging with a de-magnification or reduction (of the reticle pattern, as a result of imaging) of r=5x, NA=0.4, and 5 mm wide FOV at the workpiece 610. Central obscurations/central apertures of the elements of the system 600, if present, are not necessarily shown for simplicity of illustration. The primary mirror 614 of this design has a diameter of about 240 mm. The aspheric profiles of the mirrors 614, 616 are predominantly rotationally symmetrical, with very small astigmatic terms. No comatic Zernike terms were used in the case of on-axis illumination, but could be introduced in a specific case when the illumination is off-axis. The system further utilizes, as an object, a flat reticle or pattern-source 144, 144' that is generally separated from the primary mirror 614 by a distance between about 800 mm and 2000 mm (as shown—about 1460 mm), and from the secondary mirror 616 by about 520 mm (and, in general, between about 450 mm and 550 mm). The separation between the primary and secondary mirrors is ranging, therefore, from about 300 mm to about 1500 mm. The entrance pupil of the system 620 (not shown in FIG. 6) is at about 270 mm in diameter and is distanced from the reticle 144, 144' by a linear extent from about 1.5 m to about 1.8 m in general, and in a specific case by about L=1.68 m (while, at the same time, being separated from the reticle by the primary mirror, see FIG. 2 for comparison). The working distance w is generally between about 25 mm and about 35 mm for this embodiment (and, in a specific case, about 31 mm). Accordingly, this embodiment is characterized by a first ratio (defined as a ratio of a separation between the primary and secondary mirrors to the working distance) having a value from about 8.5 to about 60 and, in a specific case, about 31. Additionally or in the alternative, this embodiment is characterized by a second ratio (defined as a ratio of the separation between the primary and secondary mirrors to the total track length) generally having a value from about 0.2 to about 1, and in a specific case about 0.63. Here, the axial position of the aperture stop (not shown in FIG. 6) may be determined so that the entrance pupil position is on the image side of the concave mirror (the secondary mirror 616). The axial position of the aperture stop may be determined so that the entrance pupil is positioned on the image side of the convex mirror (the primary mirror 614). The axial position of the aperture stop may be determined so that the entrance pupil is positioned on the side opposite to the convex mirror with respect to the image plane. The position of the aperture stop may be determined to ensure image-side telecentricity. The aperture stop position may be determined so as to be non-telecentric on the object side.

Parameters of Zernike aberrations used for simulations of the system 600 are listed in Table 2 and FIGS. 7A, 7B). In the 1D EUV system utilizing this PO objective 600, the beam of light from the light source 114 experiences interactions with only two reflectors upon propagation through the PO portion of the optical system towards the target substrate/workpiece 156, thereby reducing the loss of optical power upon reflections as compared with the propagation of light through the 2D EUV system and, therefore, reducing the requirement on how high the output power of the EUV light source should be.

Figure 8:
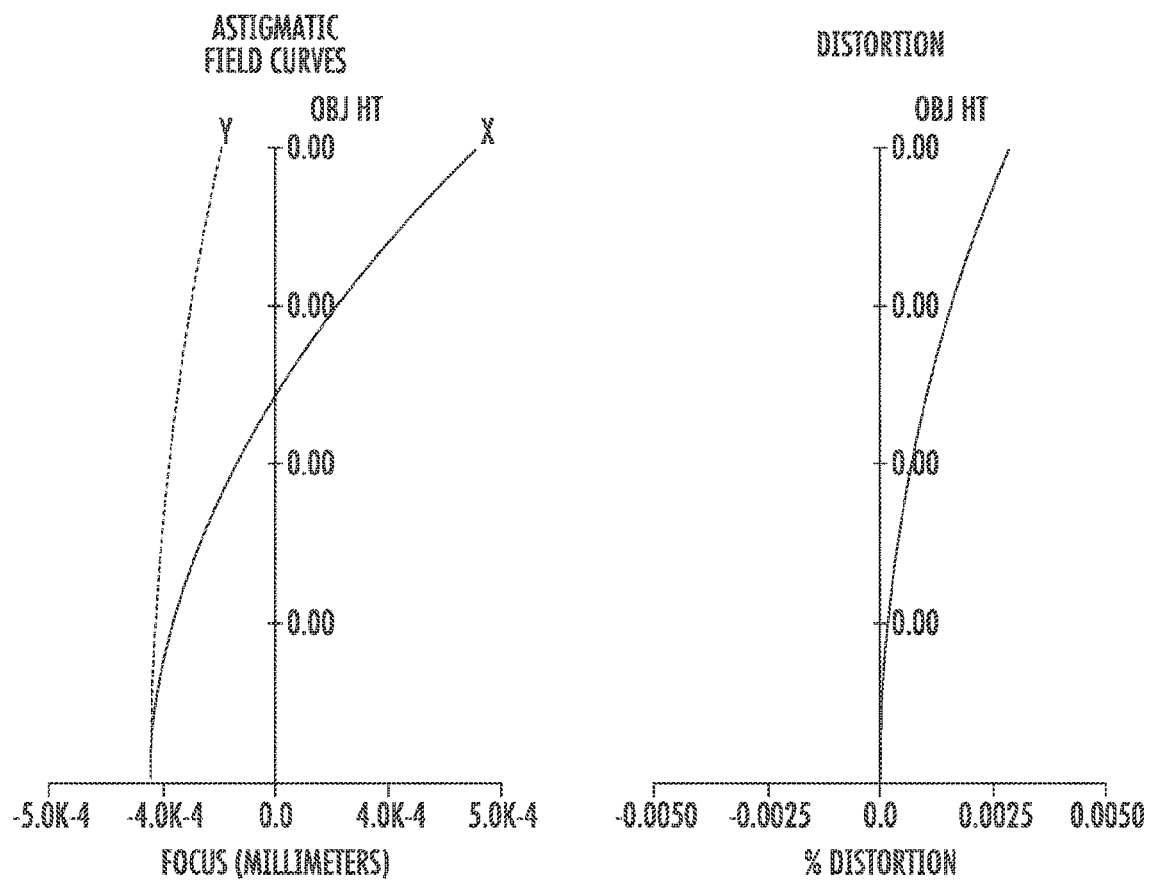
FIG. 8 provides field curves and distortion parameters of the embodiment of FIG. 6.
Figure 9A:
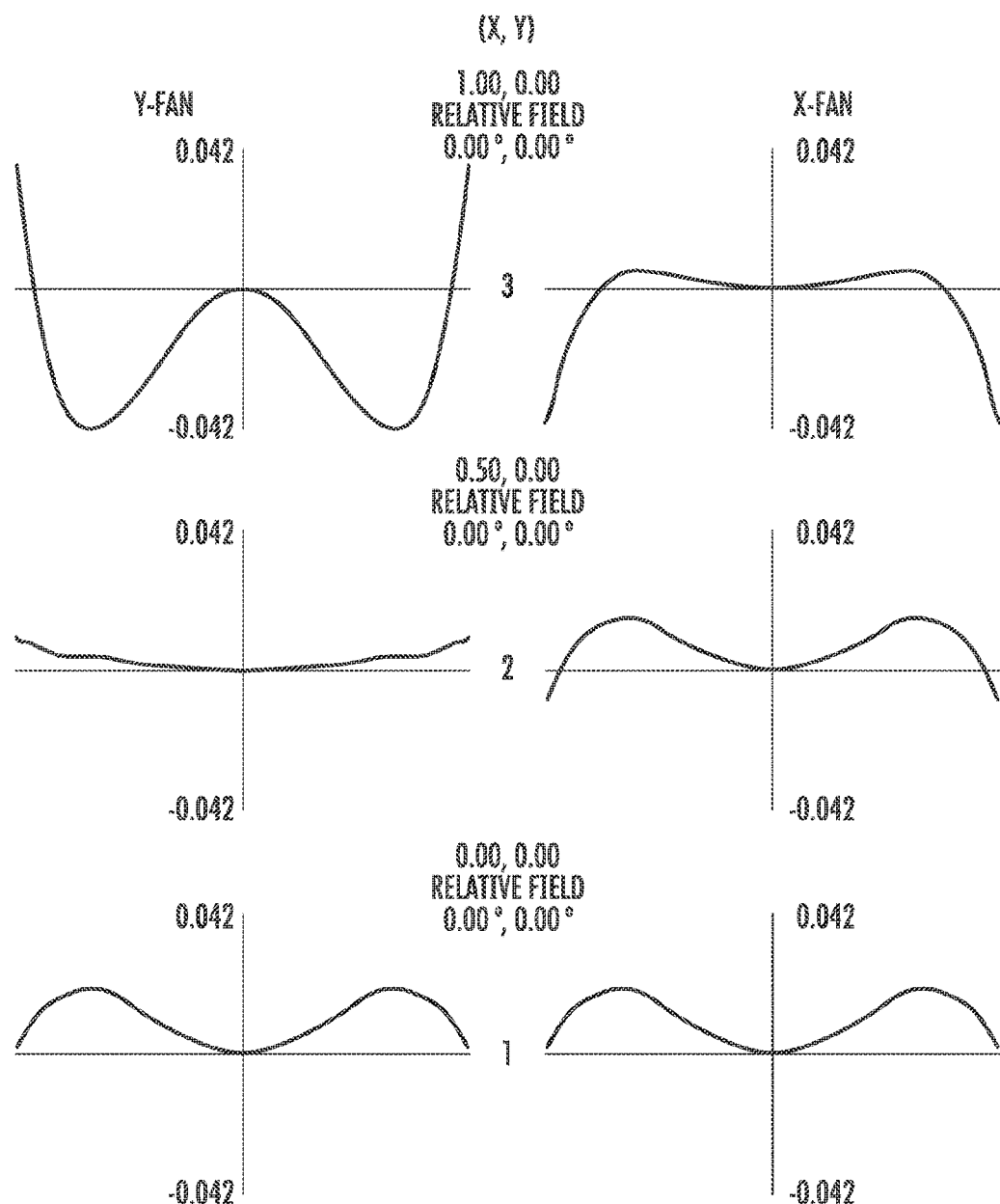
FIGS. 9A, 9B illustrate ray aberrations associated with the embodiment of FIG. 6.
Figure 9B:
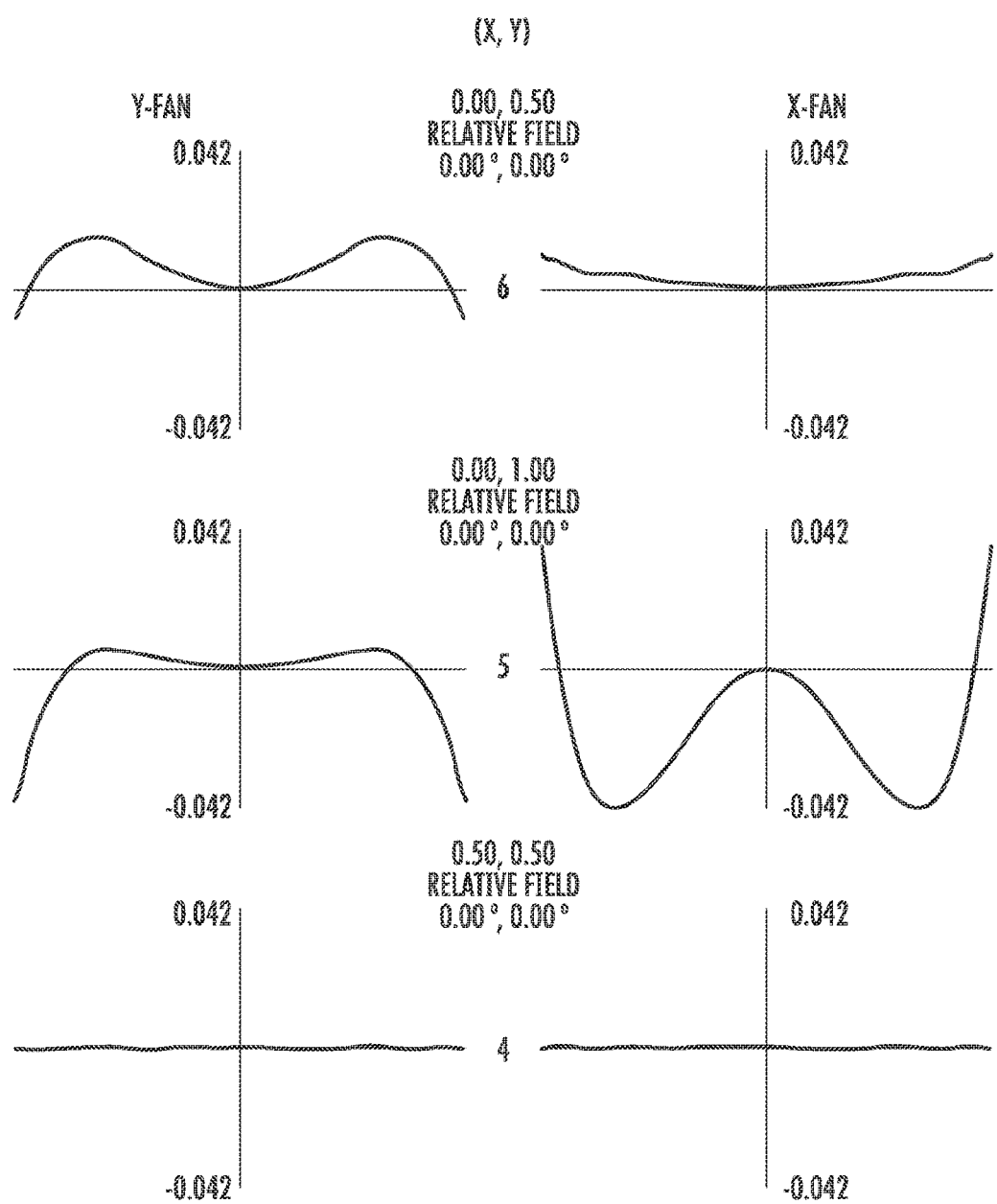

Field curves describing the optical performance of the objective 600 are illustrated in FIG. 8, while the corresponding ray aberrations for X- and Y-fan of rays are presented in plots of FIGS. 9A and 9B for different relative height values of the field. Here, the optical path difference is shown in the units of waves.

Figure 10A:
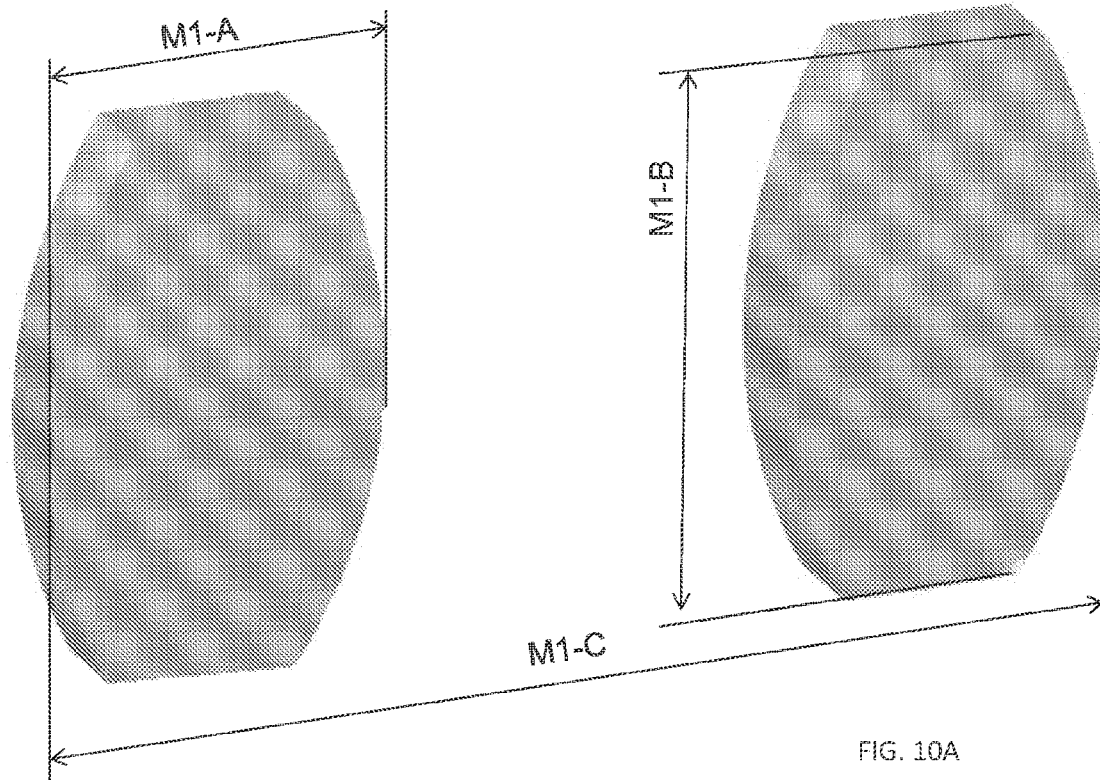
FIGS. 10A, 10B illustrate a specific version of a design of primary and secondary reflectors for use with an embodiment of the PO sub-system.
Figure 10B:
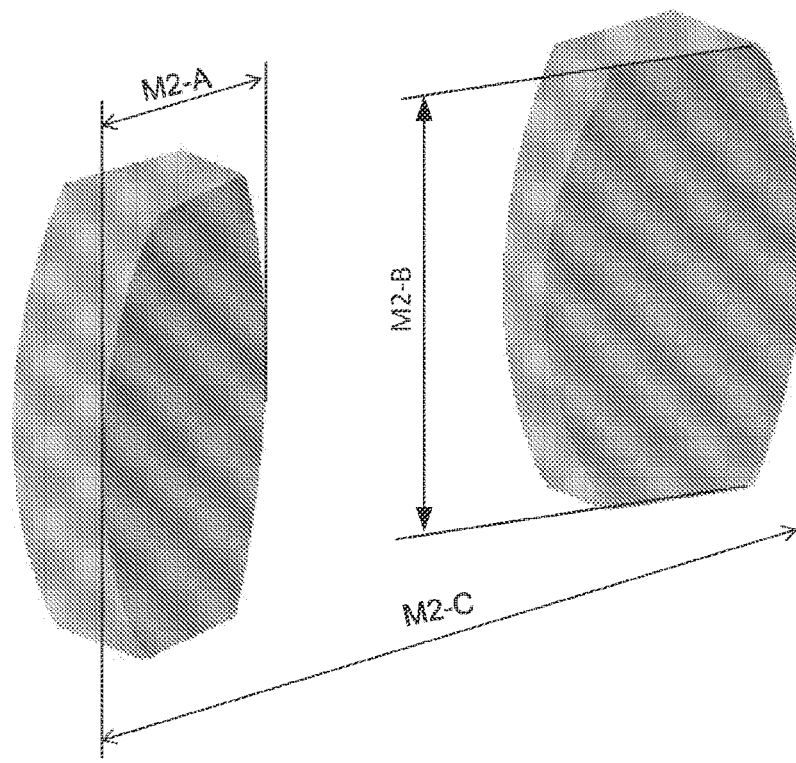

Since the pattern on the pattern-source comprises a 1D grating, incident light is diffracted approximately in the XZ plane. These circumstances are taken advantage of in a related embodiment, in which at least one (and, preferably, both) of the mirrors M1 and M2 (614, 616 in the example of embodiment 600) can be configured as two separate, spatially-separated from one another pieces or sub-reflectors. This idea is schematically illustrated in FIGS. 10A, 10B, showing the mutual orientation of the two sub-reflectors for each of the primary mirror M1 and the secondary mirror M2, with general identification of the corresponding dimensions. When so implemented, each of such corresponding-to-each-other pieces in a given pair of pieces (for example, a pair of mirror sub-reflectors 614A, 614B comprising the aspheric and convex primary mirror 614) represents and defines (that is, is congruent with) a portion of an otherwise continuous, rotationally-symmetric curved reflective surface.

A perspective view of FIG. 11 shows a specific implementation in which the pattern source 144, 144' is disposed on-axis and in which both the primary and secondary mirrors of the system 600 are configured as two-component reflectors. Element 310 indicates, as previously discussed, the pupil relay mirror which, while not necessarily being optically-conjugate to the pupil, is similar in shape to the leaf-shape of the illumination pupil (discussed in reference to FIGS. 5A through 5G).

Here, the (aspheric and concave) secondary mirror 616 is also shown to contain two substantially identical sub-reflectors 616A, 616B. In one implementation of the system 600, the dimensions of the optical pieces are as follows: M1-A is about 26 mm; M1-B is about 38 mm; M1-C (edge-to-edge dimension) is about 80 mm; M2-A is about 85 mm; M2-B is about 136 mm; and M2-C (edge-to-edge dimension) is about 275 mm.

TABLE 1

| surface # | element | surface type | curvature (1/mm) | radius of curvature (mm) | thickness (mm) | | semiaperture (mm) |
|---|---|---|---|---|---|---|---|
| 0 | Wafer | Plane | 0 | infinity | 956.8419808 | | 2.5 |
| 1 | secondary | Fringe Zernike Polynomial | −0.000991961 | −1008.104248 | −926.1368984 | REFL | 389.33866 |
| 2 | primary | Fringe Zernike Polynomial | −0.000933797 | −1070.896603 | 1459.294918 | REFL | 119.1454178 |
| 3 | grating | Plane | 0 | infinity | — | | 12.5 |

TABLE 2

| | Primary Mirror | Secondary Mirror |
|---|---|---|
| K | −7.71E+00 | |
| Normalizing Radius | 1.19E+02 | 3.89E+02 |
| Z1 | 4.61E−02 | 3.76E+00 |
| Z4 | −1.36E−02 | 3.86E+00 |
| Z9 | −6.00E−02 | 1.04E−01 |
| Z16 | −3.41E−04 | 3.42E−03 |
| Z25 | −1.65E−05 | 1.22E−04 |
| Z36 | −2.59E−07 | 4.50E−06 |
| Z37 | −4.46E−09 | 1.72E−07 |

The Zernike Polynomials are defined in radial coordinates (radial distance R and azimuth θ), or expressed in Cartesian coordinates, where X=R cos θ, Y=sin θ. (The full set of terms is summarized in the tables of FIGS. 7A, 7B.)

PO Objective: Example 2

Figure 12:
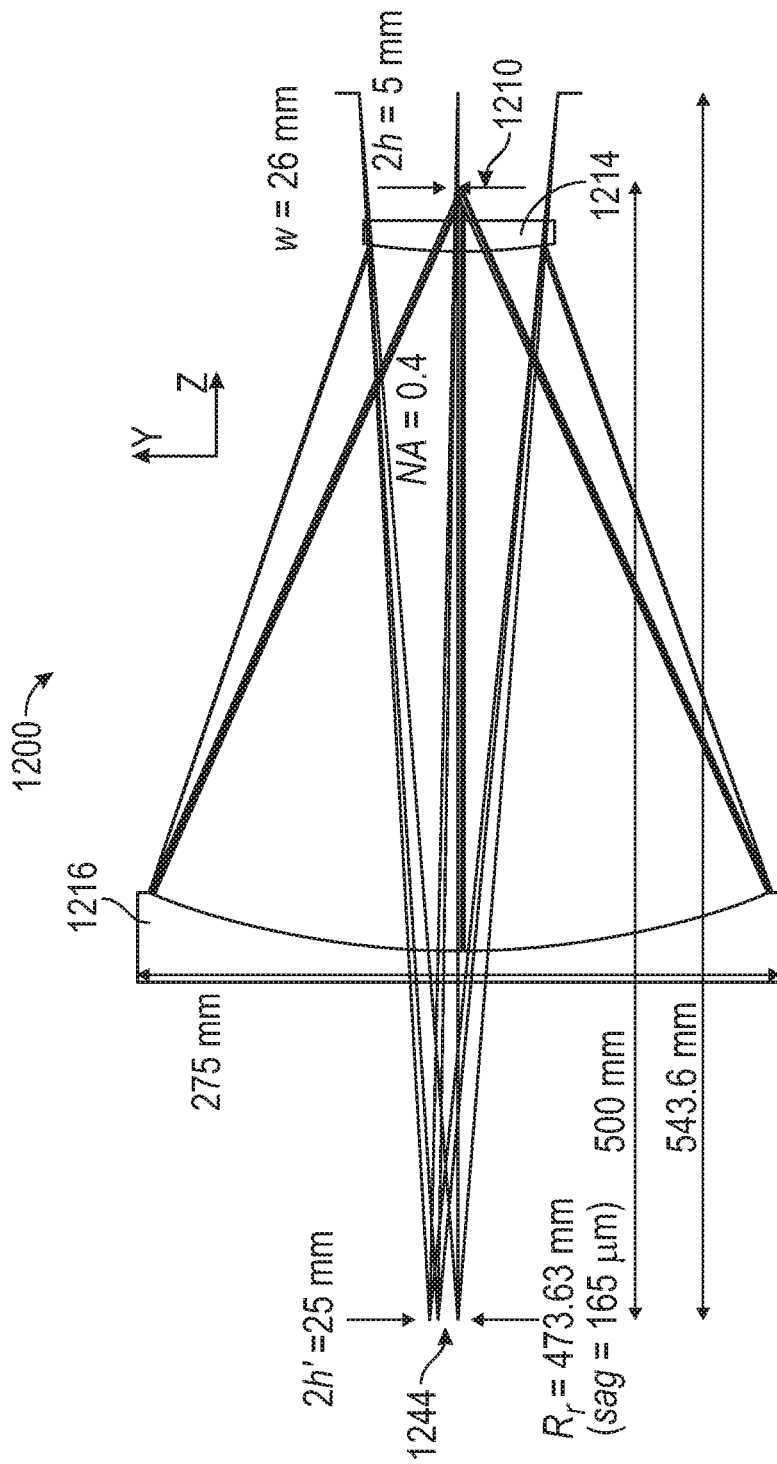
FIG. 12 provides a schematic of a related embodiment of the PO sub-system configured for imaging of a dense line pattern disposed on a curved substrate.

FIG. 12, illustrates an embodiment 1200, which is particularly configured for use with the 1D EUVD exposure system (such as that of FIG. 1C, for example) in a case requiring the imaging of a substantially 1D pattern disposed on a curved substrate or surface 1244 (which corresponds to the pattern source 144' of FIG. 1C). In a specific case such curved reflective substrate 1244 carrying a 1D diffraction grating is disposed between the IU of the overall exposure system and the PO sub-system, and due to its non-zero optical power facilitates the process of imaging of one of the reflectors 118, 122 of the overall system (for example, the reflector 122 configured as a fly-eye reflector and discussed, as reflector FE2, in any of U.S. patent application Ser. Nos. 15/599,148 and 15/599,197) into the entrance pupil of the PO sub-system to increase the overall light throughput through the 1D EUVD system.

One of the advantages of the design of this Example 2 is that, in conjunction with the curved 1D diffraction grating of the reticle element 1244, this design enables much smaller on-axis illumination projection optics as compared to the case of Example 1 (in which a planar 1D grating is preferably used). Such advantage is due to the fact that the separation between the entrance pupil of the PO sub-system 1200 and the reticle 1244 is larger than the maximum value of the spatial separation between the +1 and −1 order beams directed through the PO subsystem 1200 from the 1D grating 1244 to the workpiece 1210. (Notably, this is an indication that that the fly-eye reflector 122 imaged by the curved reticle 1244 to the entrance pupil of the PO sub-system is de-magnified/reduced in size and, therefore, naturally fits in this available spacing between the +1 and −1 order beams.) As a result, the minimum size of the curved-reticle-containing system 1200 is limited not by the field of view, but by the value of optical aberrations.

According to these considerations, the embodiment 1200 may be complemented, in practice, with a reflective element 1244 carrying a substantially 1D mask pattern on a curved substrate surface. (For example, such element is formed by defining a 1D reflective diffraction grating in association with a curved reflective surface, having radius $R_r$, as shown in FIG. 12). The purpose of using the curved reticle in the 1D EUV system utilizing the embodiment 1200 of the PO sub-system is to image an identified reflector of the illumination unit (IU) of the 1D EUV system into the entrance pupil of the embodiment 1200 of the PO objective. Due to the curvature of the reticle 1244, the size of the embodiment 1200 is limited substantially only by the dimensions of optical obscurations and/or aberrations of the embodiment, which results in a substantial reduction of the dimensions as compared to the embodiment of FIG. 600.

The PO the embodiment 1200 is configured to include a 2-mirror, monopolar (i.e., the distribution of light at any pupil plane comprises one "pole" or illuminated area) illumination sub-system.

Table 3 summarizes the parameters of the optical components of the objective 1200 configured to image the 1D pattern-carrying curved reticle onto the workpiece.

In one specific implementation, the 1D EUV system includes an anastigmatic projection-optic two-mirror system 1200 configured to provide optical imaging with a de-magnification or reduction (of the reticle pattern, as a result of imaging) of r=5x, NA=0.4, and 5 mm wide FOV at the workpiece 1210. The primary mirror 1214 of this design has a diameter of about 80 mm. The aspheric profiles of the mirrors 1214 (primary) and 1216 (secondary) are predominantly rotationally symmetrical, with very small astigmatic terms. In operation, the system 1200 further utilizes, as an object to be imaged, a curved reticle 1244 that is generally separated from the primary mirror 1214 by a distance less than 500 mm (typically—between 450 and 500 mm; as shown in this example—only by about 475 mm), and from the secondary mirror only by a linear extent from about 140 mm and 180 mm (as shown—by about 165 mm). The entrance pupil of the system (not marked in FIG. 12) is at about 88 mm in diameter and is distanced from the reticle of the 1D EUV system by a linear extent L from about 0.3 m to about 0.7 m (as shown, by about L=0.544 m) and is also separated from the reticle 1244 by the primary mirror 1214, in accord with the schematic of FIG. 2. The working distance for this embodiment is between about 20 mm and 30 mm (and in a specific case—about 26 mm).

Accordingly, this embodiment is characterized by a first ratio (defined as a ratio of a separation between the primary and secondary mirrors to the working distance) having a value from about 9.5 to about 14.5 and, in a specific case, about 12. Additionally or in the alternative, this embodiment is characterized by a second ratio (defined as a ratio of the separation between the primary and secondary mirrors to the total track length) generally having a value from about 0.5 to about 0.7, and in a specific case about 0.62.

Parameters of Qbfs polynomials, defining the asphericity of the mirror elements 1214, 1216, are listed in Table 4 and FIG. 13). In the 1D EUV system utilizing this embodiment of the PO objective, the beam of light from the light source experiences interactions with only two reflectors upon propagation through the PO portion of the optical system towards the target substrate 1210, thereby reducing the loss of optical power upon reflections as compared with the 2D EUV system and, therefore, reducing the requirement on how high the output power of the EUV light source should be.

Figure 14:
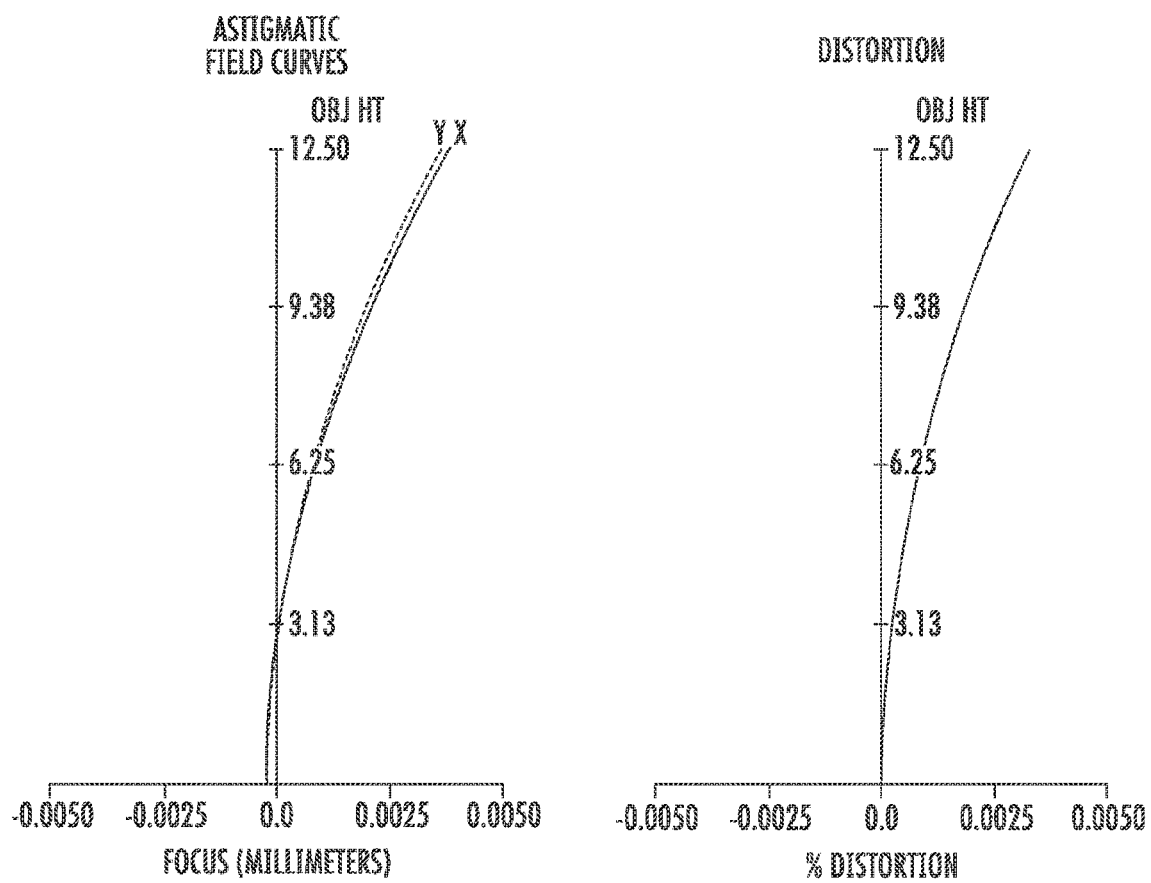
FIG. 14 provides field curves and distortion parameters of the embodiment of FIG. 12.
Figure 15A:
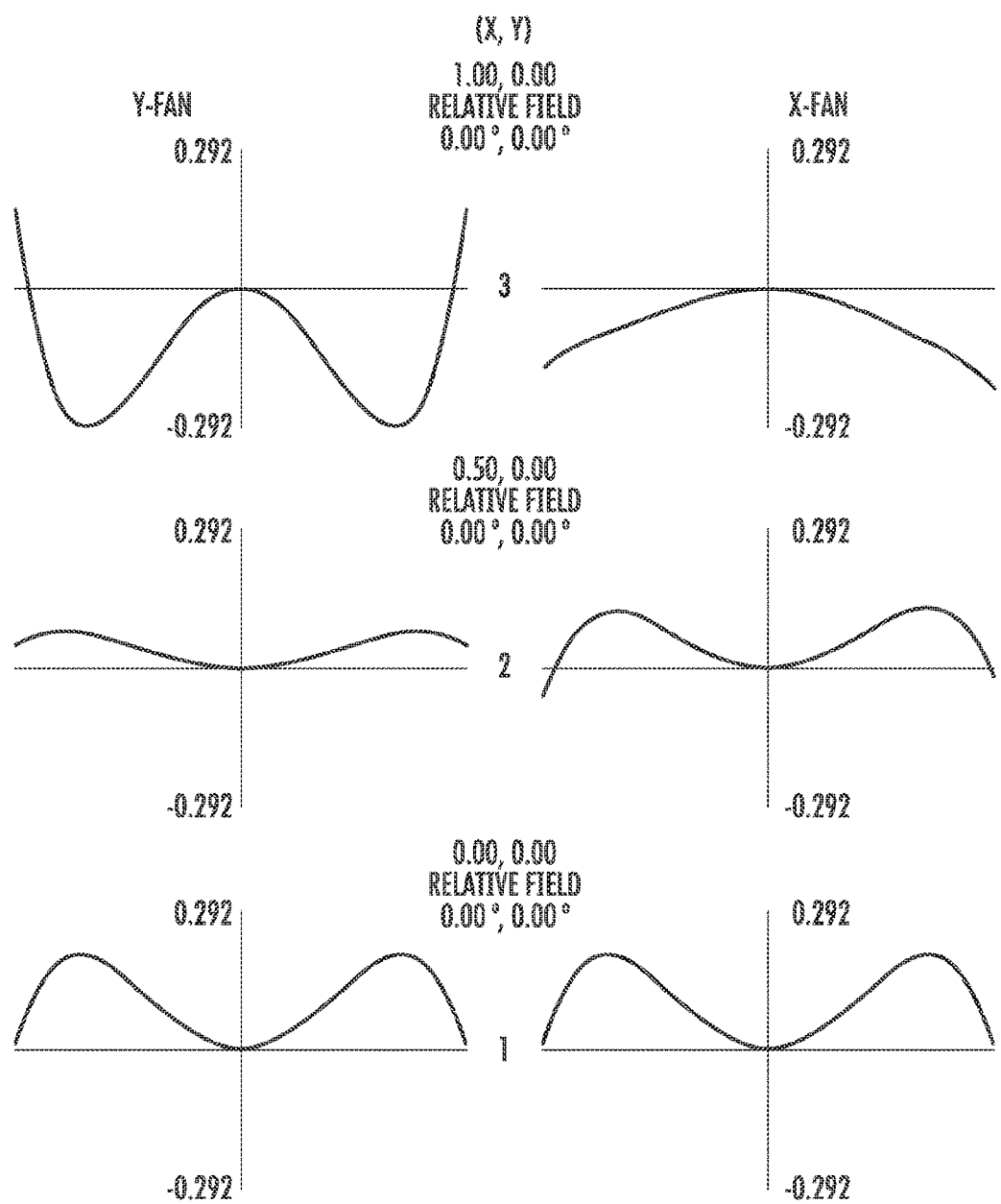
FIGS. 15A, 15B illustrate ray aberrations associated with the embodiment of FIG. 12.
Figure 15B:
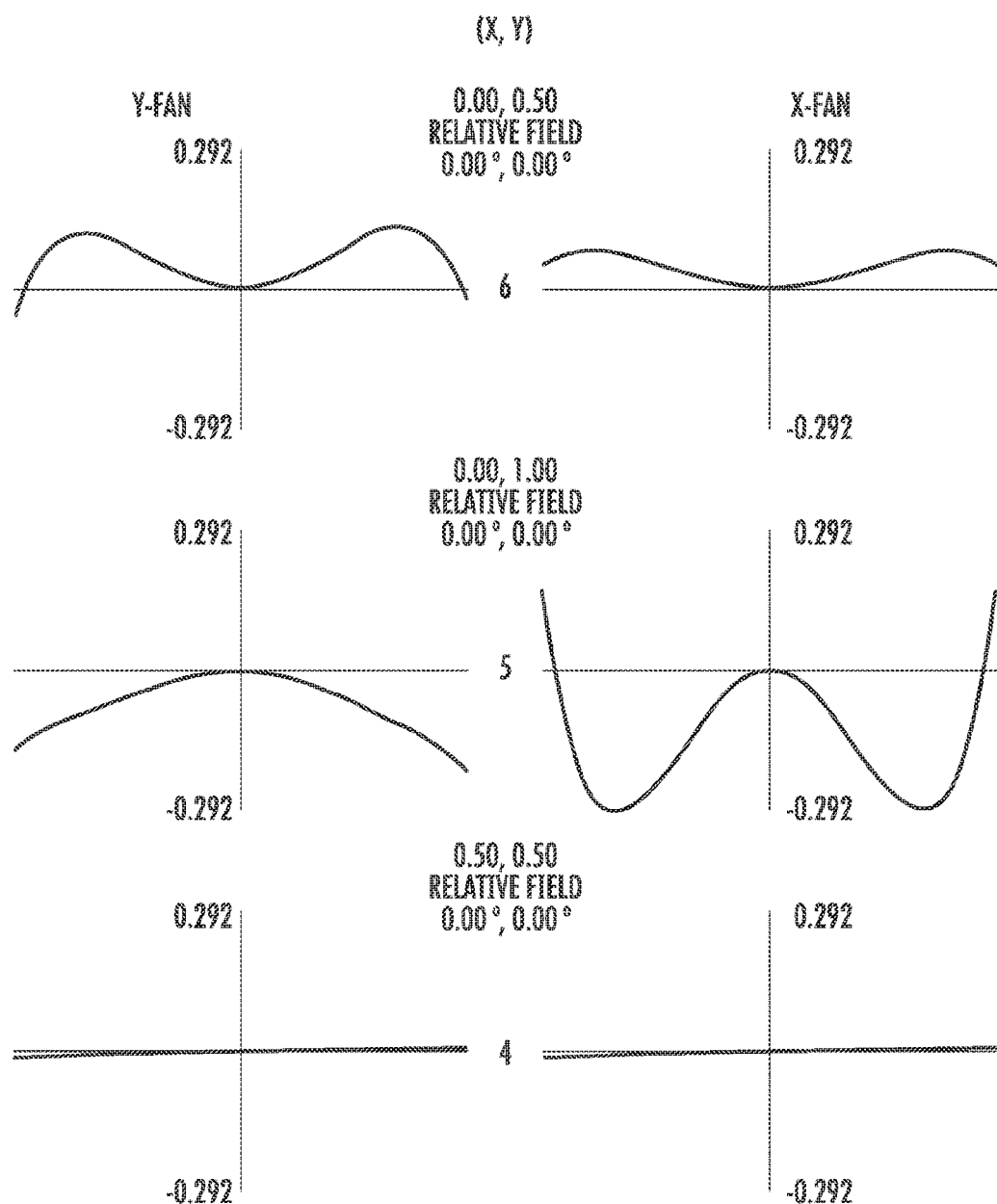

Field curves representing the optical performance of the objective of FIG. 12 are illustrated in FIG. 14, while the corresponding ray aberrations for X- and Y-fan of rays are presented in plots of FIGS. 15A and 15B for different relative height values of the field. Here, the optical path difference is shown in the units of waves.

Since the pattern on the element 1244 comprises a 1D diffraction grating, light incident on this element is from a reflector of the IU of the 1d EUV system is diffracted approximately in one, single plane—the XZ plane. These circumstances can be taken advantage of by structuring at least one (and, preferably, both) of the mirrors M1 and M2 of the objective (1214, 1216 in this example) as containing two separate pieces or sub-reflectors. Using the schematics of FIGS. 10A, 10B as a guideline, the dimensions of such two separate sub-reflectors are, in one example: for M1-A—generally between 20 and 30 mm (and, in the example of FIG. 12, about 26 mm); for M1-B—generally between about 30 and 45 mm (and, in the specific example of FIG. 12, about 38 mm); for M1-C—generally between about 70 and 100 mm (and, in the specific example of FIG. 12, about 80 mm); for M2-A—generally between about 80 and 90 mm (and, in the specific example of FIG. 12, about 85 mm); for M2-B—generally between about 120 and 150 mm (and, in the specific example of FIG. 12, about 136 mm); for M2-C—generally between about 250 mm and 300 mm (and, in the specific example of FIG. 12, about 275 mm). The surface of the primary mirror 1214 is aspheric and convex, while the surface of the secondary mirror 1216 is aspheric and concave. Here, the axial position of the aperture stop (not shown in FIG. 12) may be determined so that the entrance pupil is positioned on the image side of the concave mirror 1216. The axial position of the aperture stop may be determined so that the entrance pupil is positioned on the image side of the convex mirror 1214. The axial position of the aperture stop may be determined so that the entrance pupil is positioned on the side opposite to the convex mirror 1214 with respect to the image plane (1210). The position of the aperture stop position may be determined to ensure image-side telecentricity. The position of the aperture stop may be determined so as to be non-telecentric on the object side.

TABLE 3

| surface # | element | surface type | curvature (1/mm) | radius of curvature (mm) | thickness (mm) | | semiaperture (mm) |
|---|---|---|---|---|---|---|---|
| 0 | Wafer | Sphere | 0 | Infinity | 335.85771 | | 2.5 |
| 1 | secondary | Qbfs Asphere | −0.002655133 | −376.6289814 | −309.85771 | REFL | 137.7012608 |
| 2 | Primary | Qbfs Asphere | −0.003167428 | −315.7135654 | 474 | REFL | 39.6939682 |
| 3 | Grating | Plane | −0.002111351 | −473.6304092 | — | | 12.5 |

TABLE 4

| | Primary | Secondary |
|---|---|---|
| Normalizing Radius | 4.47E+01 | 1.37E+02 |
| Q4 | 1.26E−01 | 8.36E−02 |
| Q6 | −2.36E−03 | −2.22E−03 |
| Q8 | 8.38E−05 | 7.81E−05 |
| Q10 | −3.02E−06 | −2.72E−06 |

With respect to the designs of either Example 1 or Example 2, it should be noted that preferably—assuming the desired two-mirror-based imaging-side telecentric design permits it—the curvature of the reticle should be chosen to allow for simultaneous imaging of the illumination pupil (represented by the reflector 122) into the entrance pupil of the PO sub-system and compensation of the field-curvature—related parameter of the system (for example, to compensate Petzval curvature and to apply a phase to the reticle that also produces desired telecentricity). Additionally (and regardless of whether or not the means for blocking the light representing a zero-order reflection at the reticle 144,144', 1244 is shown in a corresponding Figure), such means is preferably provided by configuring the element 122 (in one case configured as a fly's eye reflector array) to performs this task. The position of the exit pupil is determined such as to ensure that the workpiece (wafer) is irradiated telecentrically.

PO Objective: Example 3

A related embodiment of the PO-objective configured for use with the embodiment of the 1D EUV system was disclosed in U.S. patent application Ser. No. 15/599,148, and is reproduced here in reference to FIGS. 18A, 18B.

Figure 18A:
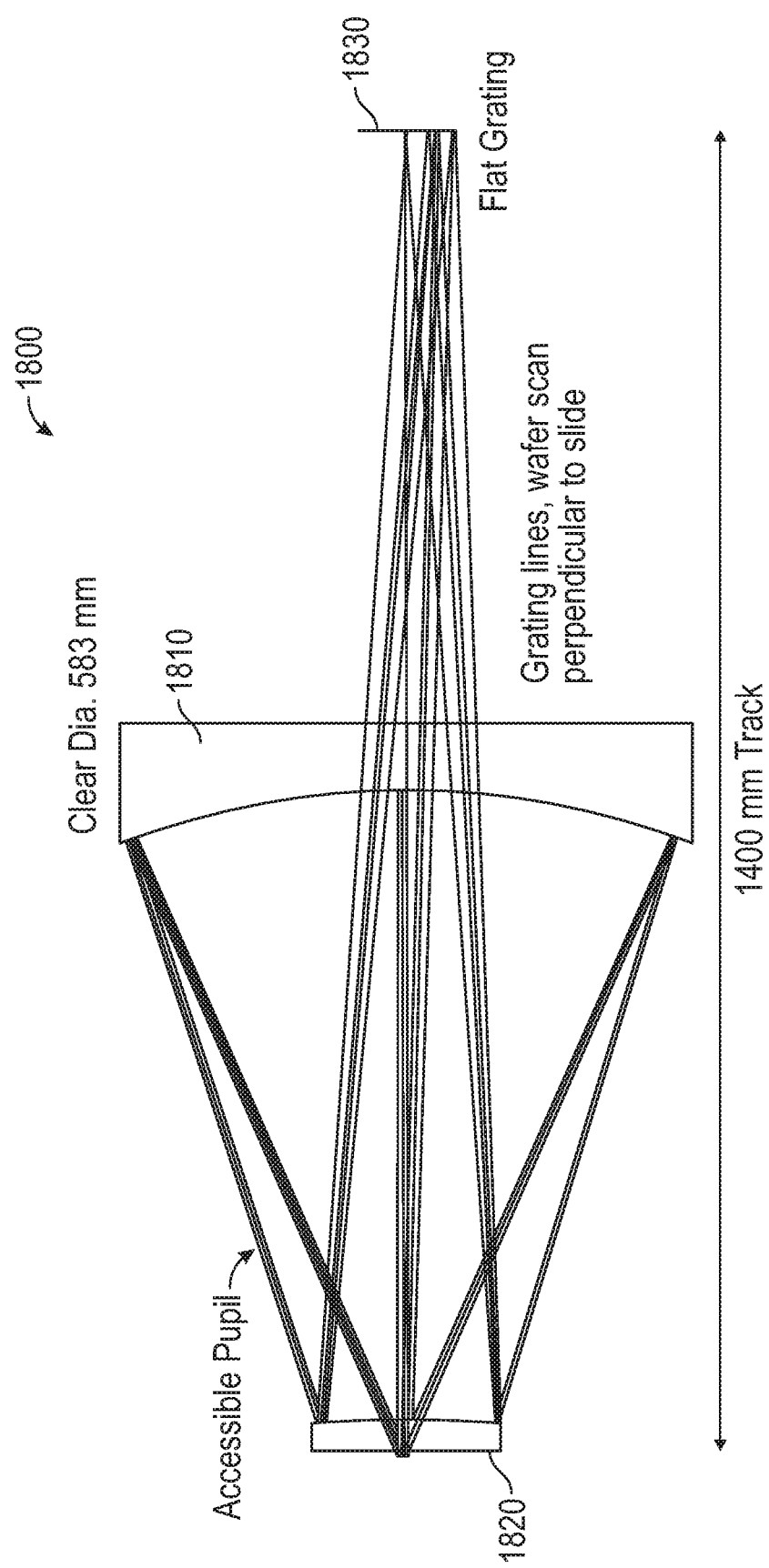
FIG. 18A shows an embodiment of a projection optic design.

In case of the specific implementation of FIG. 18A, for example, the 1D EUV system includes an anastigmatic projection-optic two-mirror system 1800 configured to provide optical imaging with a de-magnification or reduction (of the reticle pattern, as a result of imaging) of 6×, NA=0.4, and a diamond-shaped exposure of 16.5 mm (diameter) by 5 mm on the wafer (16.5 mm denotes the field width in the X direction, normal to the scanning direction; 5 mm denotes the field length in the Y direction, which is parallel to the printed lines and the direction of the wafer stage scanning motion), within which the aberrations were small (about 12 milliwaves or less), when on-axis illumination is used. The chosen shape of such diamond-shaped exposure field is appropriate for stitching of immediately adjacent fields. The primary mirror 1810 of this design has diameter of about 583 mm. The aspheric profiles of the mirrors 1810 (primary), 1820 (secondary) were predominantly rotationally symmetrical, with very small astigmatic terms. No comatic Zernike terms were used in the case of on-axis illumination, but could be introduced in a specific case when the illumination is off-axis. The system further utilizes a flat reticle that is separated from the secondary mirror by a distance between about 800 mm and 2000 mm (as shown—about 1400 mm). The entrance pupil of the system 1800 is at about 2.175 m from the reticle of the 1D EUV system (near the wafer/substrate), while the distance from the reticle to the mirror 1810 is about 1 m. Parameters of Zernike aberrations used for simulations of the system 300 are listed in FIG. 18B). In so-implemented 1D EUV system, the beam of light from the light source experiences interactions with only six reflectors upon propagation towards the target substrate (two reflections at the reflector-arrays of the IU and one at the relay mirror; one reflection at the reflective reticle; and two reflections at the mirrors of the PO), thereby reducing the loss of optical power upon reflections as compared with the 2D EUV system and, therefore, reducing the requirement on how high the output power of the EUV light source should be. (Indeed, in a typical 2D EUV system the beam of light is reflected at least twelve times or more by the reflectors forming the optical train of the system.) Here, the axial position of the aperture stop (not shown in FIG. 18A) may be determined so that the entrance pupil is located on the image side of the concave mirror 1810. The axial position of the aperture stop may be determined so that the entrance pupil is located on the image side of the convex mirror 1820. The axial position of the aperture stop may be determined so that the entrance pupil is located on the side opposite to the convex mirror 1820 with respect to the image plane. The aperture stop position may be determined to ensure image-side telecentricity. The aperture stop position may be determined so as to be non-telecentric on the object side.

Since the pattern on the reticle comprises a 1D grating pattern, incident light is diffracted approximately in the XZ plane. Therefore it is possible to configure each of the mirrors 1810, 1820 as two separate pieces that provide the necessary portions of a theoretically continuous, annular, curved reflective surface. Such configuration is carried out in a fashion described in reference to FIGS. 10A, 10B, for example.

Figure 16:
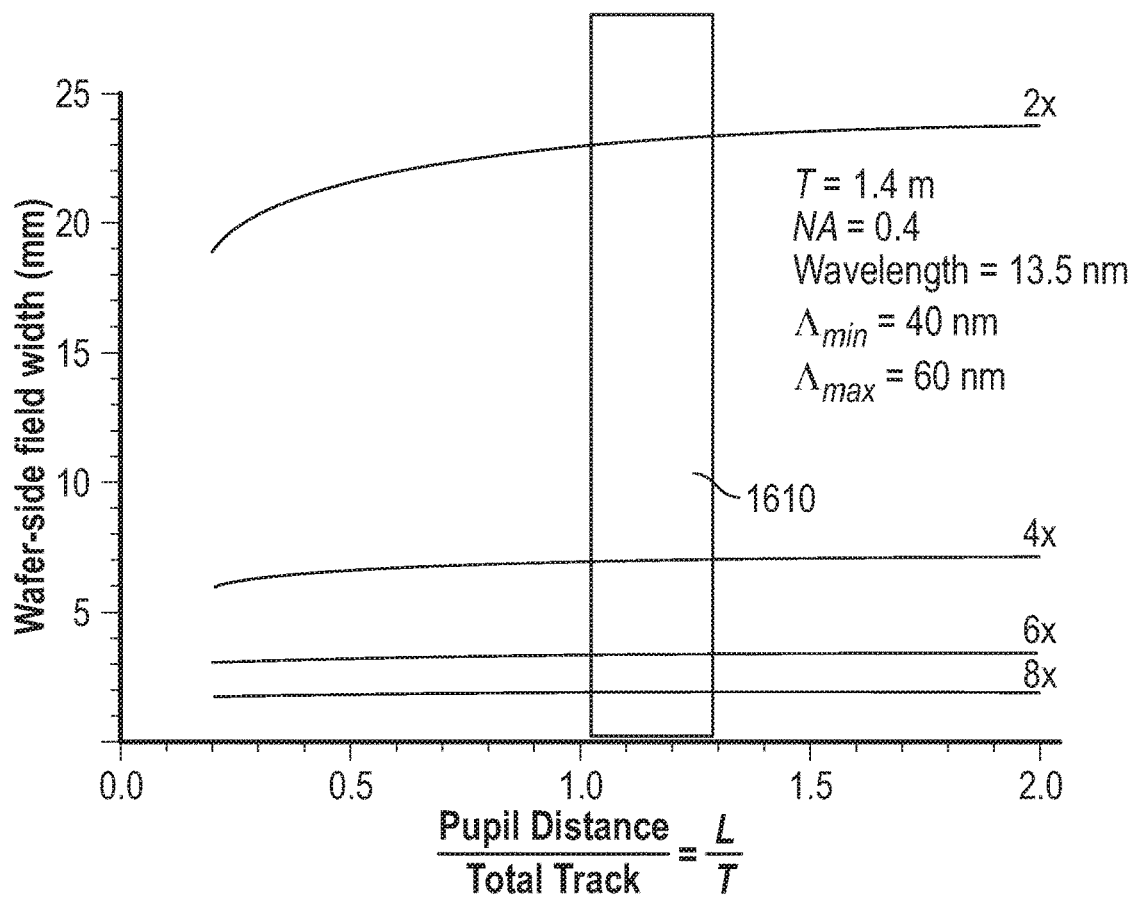
FIG. 16 provides plots illustrating the length of an embodiment of the PO sub-system as a function of reduction ratio and field size.
Figure 17:
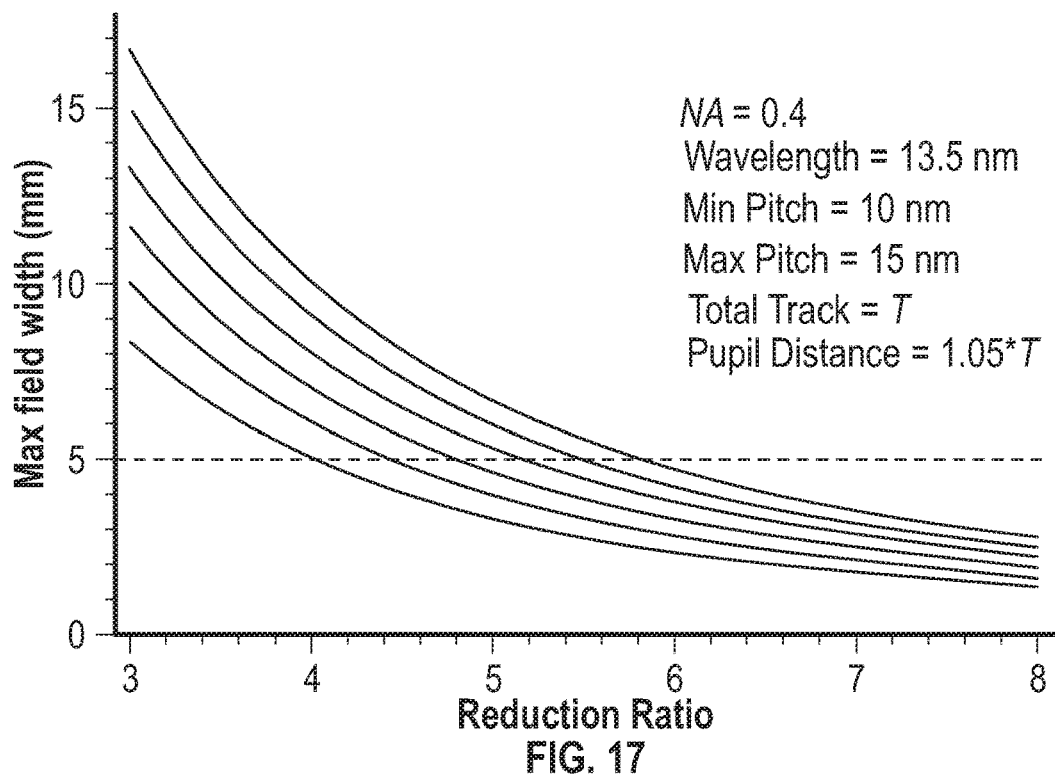
FIG. 17 illustrates substantial insensitivity of a design of an embodiment of the PO sub-system to the pupil distance, for various reduction ratios.

Examples of the PO sub-systems configured according to the present idea would not be quite complete without noting that, advantageously, the proposed designs are rather insensitive to errors or variations in main geometrical parameters of the design (such as a ratio of a pupil distance to the total track of the PO sub-system, for example). This is evidenced by FIG. 16, in which the field width in the image space (plotted along the y-axis of the graph of FIG. 16) is proven to remain substantially constant as a function of such ratio at least for the range of demagnification values between r=2 (indicated as "2×") and r=8 (indicated as "8×"). In practice, a design window 1610 can be safely chosen, which is centered, for example, on the value of L=1.05T, to ensure the insensitivity of the design to the variation of the value of the ratio). FIG. 17 complements this conclusion by illustrating that the target 5 mm field in the image space (see 156, 2 h=5 mm in FIG. 2) is readily achieved for different track lengths with a corresponding reduction (demagnification) value or ratio r at least within the range of reduction ratio r=4 . . . 8.

Overall, several examples were discussed that implement a catoptric PO sub-system configured for use with a lithographic exposure tool to image an extremely-dense 1D pattern in the EUV portion of the spectrum. While specific values chosen for this embodiment are recited, it is to be understood that, within the scope of various implementations of the invention, the values of all of parameters may vary over wide ranges to suit different applications.

Examples included a catoptric system having a reference axis and comprising first, second, and third reflectors. The first reflector contains a pattern-source. A combination of the second and third reflectors is configured to form an optical image with a reduction factor N>1, of a substantially one-dimensional (1D) pattern of the pattern-source in extreme UV light, with the use of only two beams of light, in a plane that is optically-conjugate to the first reflector. Here, these only two beams of light originate at the first reflector as a result of irradiation of the first reflector with an incident beam of light, and these only two beams of light do not include a beam of light that represents a specular reflection of said incident beam of light at the first reflector. Alternatively or in addition, such only two beams of light do not include a beam of light that is substantially co-directional with the reference axis.

In one implementation, the combination of the second and third reflectors is configured to not reduce contrast of the optical image in a spatial-frequency-dependent fashion. Alternatively or in addition, such combination is configured to form optical image with contrast that remains substantially unchanged across an area of the optical image. When the first reflector has a first radius of curvature and the second reflector has a second radius of curvature, the first and second radii of curvature having opposite signs. The first reflector may include a 1D diffractions grating defined at a curved surface and/or a phase-shift mask. In a specific implementation, where the 1D pattern of the pattern source has a first spatial frequency, the catoptric system is configured to ensure that the optical image of such pattern has a second spatial frequency, and the second optical frequency is at least twice the first optical frequency. The catoptric system may be structured as a projection optical system of a lithographic exposure tool.

Examples additionally disclosed a catoptric system having an reference axis and comprising a first pair of reflector elements (that are symmetric to one another about the reference axis) and a second pair of reflector elements (that are symmetric to one another about the reference axis), and in which reflecting surfaces of reflector elements from the first pair and are facing reflecting surfaces of reflector elements from the second pair. In such a system, each of the reflecting surfaces of the reflecting elements from the first pair is convex and/or each of the reflecting surfaces of the reflecting elements from the second pair is concave. In a specific case, the reflecting surfaces of the reflector elements from the first pair are symmetric to one another about a plane containing the optical axis and/or the reflecting surfaces of the reflector elements from the second pair are symmetric to one another about such plane.

In one implementation of such catoptric system, the reflector elements from the first pair are separated from one another with a first gap along a first axis, where in the first axis is transverse to the optical axis, while the catoptric system is configured to image the 1D pattern onto an image plane (which is separated from the second pair of the reflector elements by the first pair of the reflector elements) with a reduction ratio having a value at least between 4 and 6. In a specific case of such implementation, the reduction ratio is equal to 5 and a length of the catoptric system is about 0.5 m, such length defined by a distance separating the first pair of reflectors from the second pair of reflectors. Alternatively or in addition, such implementation may further include a patterned reflector that carries a substantially one-dimensional pattern characterized by a pattern period between about 40 nm and 60 nm, while the system is configured to image such pattern onto the image plane at a wavelength of about 13.5 nm. (In a specific case, a surface of such patterned reflector may be planar or curved).

Alternatively or in addition, the working distance (defined by a separation between the image plane and a vertex of a surface containing both of the reflecting surfaces of the reflecting elements from the first pair) in such system is about 30 mm, and/or the reduction ratio is equal to 5 while a length of the catoptric system (defined by a distance separating the first pair of reflectors from the second pair of reflectors defined by a distance separating the first pair of reflectors from the second pair of reflectors) is about 0.3 m. In a specific case of this implementation, the working distance of about 25 mm. Alternatively or in addition, this embodiment is characterized by a first ratio (defined as a ratio of a separation between the primary and secondary mirrors to the working distance) having a value from about 9.5 to about 14.5 and, in a specific case, about 12. Additionally or in the alternative, this embodiment is characterized by a second ratio (defined as a ratio of the separation between the primary and secondary mirrors to the total track length) generally having a value from about 0.5 to about 0.7, and in a specific case about 0.62.

In one implementation of such catoptric system, a reflecting surface of one of the reflector elements from the first pair is defined as a first portion of a first surface that is rotationally-symmetric about the optical axis, and a reflecting surface of another of the reflector elements from the second pair is defined as a portion of said surface that is rotationally-symmetric about the reference axis. Alternatively or in addition, such implementation includes an auxiliary reflector disposed on the reference axis between the first and second pairs of reflector elements. The catoptric system may be configured as a projection optics portion of an optical system of a lithographic exposure tool.

Examples additionally disclosed a catoptric system that has a reference axis and includes (i) a primary mirror unit made of a first material and having a first area centered on the optical axis (where the first area is devoid of the first material) and a secondary mirror unit made of a second material and having a second area centered on the optical axis (the second area being devoid of the second material). Such catoptric system has a length, defined by distance separating the primary and secondary mirror units, of approximately 0.3 m, and is configured to image a substantially one-dimensional pattern through the first and second areas onto an image plane in extreme UV light with a reduction ration between 4 and 6. The substantially one-dimensional pattern is characterized by a pattern period between about 40 nm and about 60 nm and is associated with (in one case—carried by) a curved surface of an object. The image plane is distanced from the primary mirror by about 25 mm and is separated from the secondary mirror unit by the primary mirror unit. In one case, at least one of the primary and secondary mirror units contains a spatially-separated from one another two reflector elements and/or the reflecting surfaces of such two reflector elements may be symmetric to one another about a plane containing the reference axis.

Accordingly, this embodiment is characterized by a first ratio (defined as a ratio of a separation between the primary and secondary mirrors to the working distance) having a value from about 8.5 to about 60 and, in a specific case, about 31. Additionally or in the alternative, this embodiment is characterized by a second ratio (defined as a ratio of the separation between the primary and secondary mirrors to the total track length) generally having a value from about 0.2 to about 1, and in a specific case about 0.63.

The system may additionally include an auxiliary reflector disposed on the reference axis between the primary and secondary mirror units. The system may additionally contain a patterned reflector that carries a substantially one-dimensional pattern on a surface that is spatially curved. In one case, the system is structured as a projection optical system of a lithographic exposure tool.

A person of ordinary skill in the art will readily appreciate that the on-axis positioning of the pattern-source 144, 44', 1244 may be preferred for compactness of the overall PO sub-system of the 1D EUV system, and probably also for ease of fabrication of the system. Off-axis positioning, however, is also very reasonable, and may result in at least two advantages: (1) easier implementation of rejection of zero-order diffracted beam (i.e., a beam representing specular reflection of incident radiation by the pattern-source), and (2) a larger space available for positioning of the element 310 or the pupil relay reflector while achieving substantially the same operational characteristics of the PO sub-system.

Possible—if present at all—shadowing effects caused by difference in angles at which the chief ray propagates through the system (for example, a difference between a value corresponding to the center of the reticle and a value corresponding to a peripheral location at the reticle) in the case when the substantially one-dimensional pattern is configured on a flat surface (~flat reticle), are substantially smaller than those present in a conventional rotationally-symmetric EUV system that require an annular object field that is far off-axis (in which conventional case the "shadowing" effect is large to begin with and varies strongly across the field). Moreover, implementation of the presently-discussed PO system additionally mitigates the effect by averaging due to the use of fixed reticle.

Figure 20A:
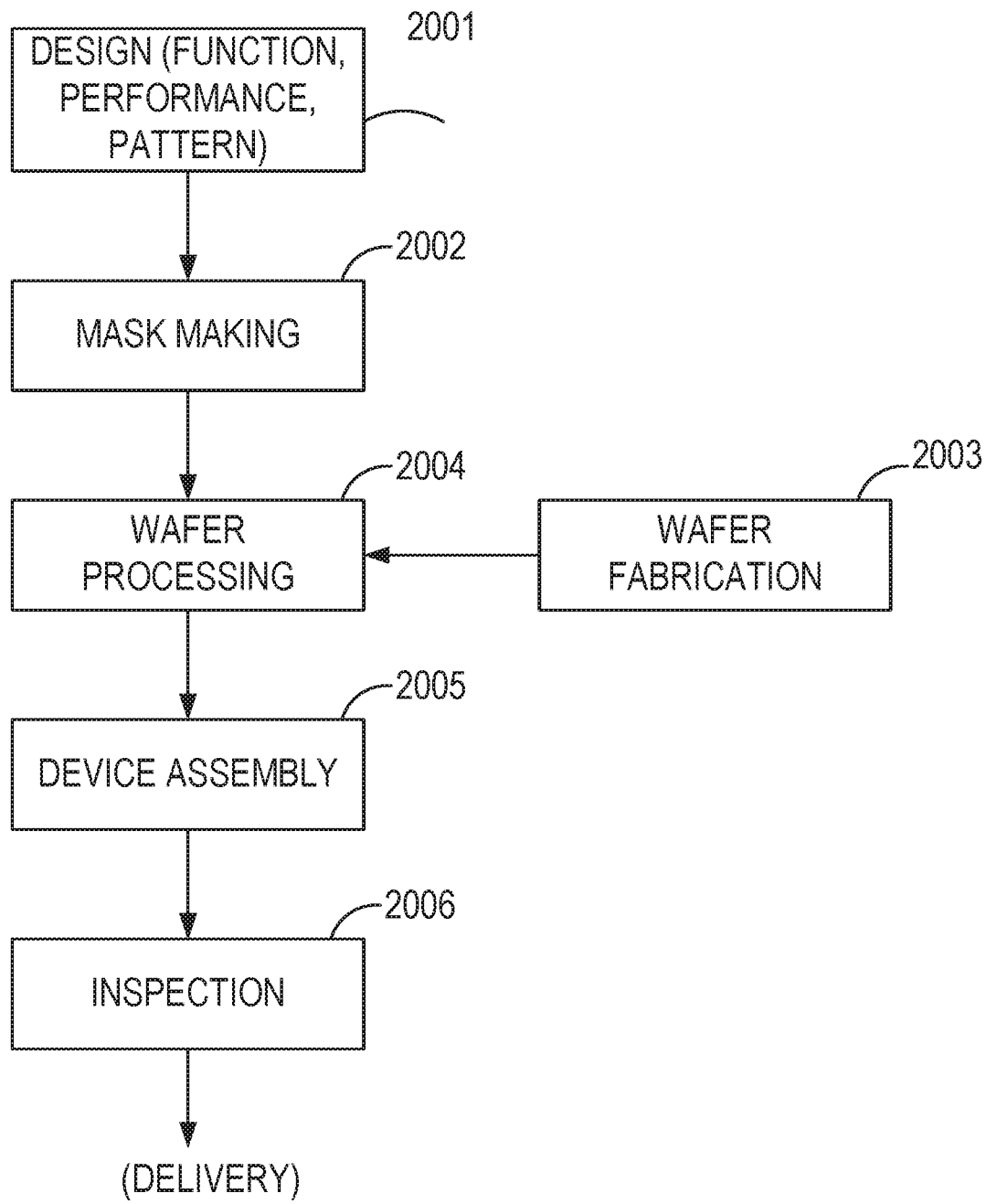
FIGS. 20A, 20B present flow charts outlining a process for manufacturing a device with the use of disclosed embodiment(s).

Further, the above described systems can be used for fabrication of a semiconductor device with the process illustrated schematically in FIG. 20A. In step 2001 the device's function and performance characteristics are devised. Next, in step 2002, a mask (reticle) having a substantially 1D pattern (as discussed above) is designed according to the previous designing step 2001, and in a parallel step 2003 a workpiece is made from a silicon material. The mask pattern formed according to the results of step 2002 is exposed to illuminating radiation and an image of this pattern is transferred onto and formed in the workpiece, in step 2004, with the use of a photolithography system that employs the 1D EUV optics discussed above. In step 2005, the semiconductor device is assembled (including the dicing process, bonding process and packaging process), finally, the device is then inspected in step 2006.

Figure 20B:
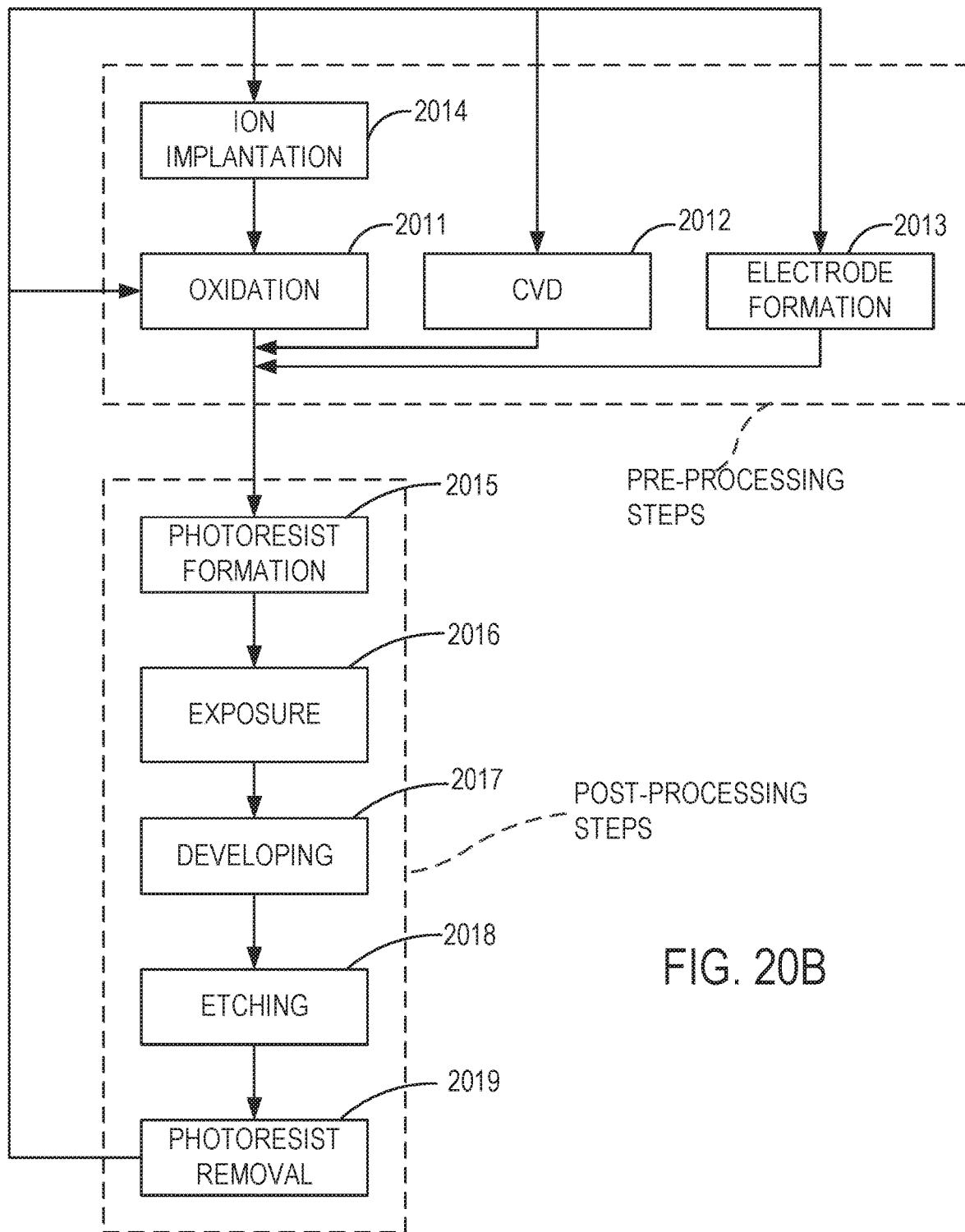

FIG. 20B provides an example of a detailed flowchart detailing the above-mentioned step 2004. As shown, at step 2011 (oxidation step), the workpiece surface is oxidized. In step 2012 (CVD step), an insulation film is formed on the workpiece surface. In step 2013 (electrode formation step), electrodes are formed on the workpiece with the use of vapor deposition. In step 2014 (ion implantation step), ions are implanted into the body of the workpiece. The above-mentioned steps 2011 through form the preprocessing steps for workpieces during workpiece-processing, and selection of operational parameters is made at each step according to processing requirements.

At each stage of workpiece-processing, when the above-mentioned preprocessing steps have been completed, the following post-processing steps may be implemented. During post-processing, first, in step 2015 (photoresist formation step), photoresist is applied to a workpiece. Next, in step 2016 (exposure step), the above-mentioned exposure device is used to transfer the circuit pattern of a mask (reticle) to the workpiece. Then in step 2017 (developing step), the exposed workpiece is developed, and in step 2-18 (etching step), parts other than residual photoresist (exposed material surface) are removed by etching. In step 2019 (photoresist removal step), unnecessary photoresist remaining after etching is removed. Multiple circuit patterns are formed by repetition of these preprocessing and post-processing steps.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself.

The use of these term in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

For example, a reference to an identified vector or line or plane being substantially parallel to a referenced line or plane is to be construed as such a vector or line or plane that is the same as or very close to that of the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree). For example, a reference to an identified vector or line or plane being substantially perpendicular to a referenced line or plane is to be construed as such a vector or line or plane the normal to the surface of which lies at or very close to the referenced line or plane (with angular deviations from the referenced line or plane that are considered to be practically typical in related art, for example between zero and fifteen degrees, preferably between zero and ten degrees, more preferably between zero and 5 degrees, even more preferably between zero and 2 degrees, and most preferably between zero and 1 degree).

Other specific examples of the meaning of the terms "substantially", "about", and/or "approximately" as applied to different practical situations may have been provided elsewhere in this disclosure.

An embodiment of the system generally includes electronic circuitry (for example, a computer processor) controlled by instructions stored in a memory, to perform specific data collection/processing and calculation steps as disclosed above. The memory may be random access memory (RAM), read-only memory (ROM), flash memory or any other memory, or combination thereof, suitable for storing control software or other instructions and data. Those skilled in the art should would readily appreciate that instructions or programs defining the operation of the present embodiment(s) may be delivered to a processor in many forms, including, but not limited to, information permanently stored on non-writable storage media (e.g. read-only memory devices within a computer, such as ROM, or devices readable by a computer I/O attachment, such as CD-ROM or DVD disks), information alterably stored on writable storage media (e.g. floppy disks, removable flash memory and hard drives) or information conveyed to a computer through communication media, including wired or wireless computer networks. In addition, while the invention may be embodied in software, the functions necessary to implement a method of the invention may optionally or alternatively be embodied in part or in whole using firmware and/or hardware components, such as combinatorial logic, Application Specific Integrated Circuits (ASICs), Field-Programmable Gate Arrays (FPGAs) or other hardware or some combination of hardware, software and/or firmware components.

The invention as recited in claims appended to this disclosure is intended to be assessed in light of the disclosure as a whole. Various changes in the details, steps and components that have been described may be made by those skilled in the art within the principles and scope of the invention.

Modifications to, and variations of, the illustrated embodiments may be made without departing from the disclosed inventive concepts. Furthermore, disclosed aspects, or portions of these aspects, may be combined in ways not listed above. Accordingly, the invention should not be viewed as being limited to the disclosed embodiment(s).

What is claimed is:

1. An optical imaging system having an optical axis and operable to form an image of an object, the optical imaging system comprising:
    a convex reflector unit situated on the optical axis and defining a first opening therein;
    a concave reflector unit situated on the axis and defining a second opening therein; and
    an illumination reflector element disposed on the optical axis between the convex reflector unit and the concave reflector unit,
    the system configured to:
    receive, at a surface of the convex reflector unit, optical radiation in a form of two diffracted beams of radiation produced by a substantially one-dimensional (1D) diffractive structure defined by the object, and delivered thereto through the second opening, and form an image of the object by irradiating an image plane with the optical radiation after the optical radiation has been reflected from a surface of the concave reflector unit and after the optical radiation has passed through the first opening, wherein the illumination reflector element is situated to reflect an illumination radiation to the object, the two diffracted beams of radiation generated at the object in response to the illumination radiation from the illumination reflective element, and the illumination reflective element is situated to block light propagating between the two diffracted beams of radiation from the object.

2. The optical imaging system according to claim 1, wherein at least one of the convex reflector unit and the concave reflector unit includes a first reflecting element and a second reflecting element separated by a gap, the gap corresponding to at least one of the first opening and the second opening, the optical axis passing through the gap.

3. The optical imaging system according to claim 1, wherein at least one of a surface of the concave reflector unit and a surface of the convex reflector unit is congruent with a portion of a rotationally symmetric surface.

4. The optical imaging system according to claim 1, configured as a projection optical system of a lithographic exposure tool.

5. The optical imaging system according to claim 1, wherein the two diffracted beams of radiation are the only two beams of radiation received at the surface of the concave reflector unit and used to form the image.

6. The optical imaging system according to claim 5, configured to form the image by using the two diffracted beams of the radiation each of which carries the radiation that has diffracted on a substantially one-dimensional (1D) diffractive structure associated with the object.

7. The optical imaging system according to claim 6, wherein the substantially 1D diffractive structure includes a diffraction phase grating.

8. The optical imaging system according to claim 6, wherein the substantially 1D diffractive structure is disposed on a spatially-curved surface.

9. The optical imaging system according to claim 1, wherein at least one of the following conditions is satisfied:
(i) a value of a first ratio is between about 8.5 and about 60; the first ratio defined as a ratio of a separation between the convex reflector unit and the concave reflector unit to a working distance of the system; and
(ii) a value of a second ratio is between about 0.2 and about 1.0, the second ratio defined as a ratio of a separation between the convex reflector unit and the concave reflector unit to a total track length of the system.

10. The optical imaging system according to claim 9, wherein an entrance pupil of the system is separated from a reticle of the system by a distance from about 1.5 m to about 1.8 m.

11. The optical imaging system according to claim 1, wherein at least one of the following conditions is satisfied:
(i) a value of a first ratio is between about 9.5 and about 14.5, the first ratio defined as a ratio of a separation between the convex reflector unit and the concave reflector unit to a working distance of the system; and
(ii) a value of a second ratio is between about 0.5 and about 0.7, the second ratio defined as a ratio of the separation between the convex reflector unit and the concave reflector unit mirrors and a total track length of the system.

12. The optical imaging system according to claim 11, wherein an entrance pupil of the system is separated from a reticle of the system by a distance from about 0.3 m to about 0.7 m.

13. An exposure apparatus comprising:
the optical imaging system according to claim 1; and
a workpiece stage dimensioned to hold a workpiece on which radiation is delivered through the optical imaging system.

14. A device manufacturing method comprising:
exposing the substantially 1D diffractive structure to radiation with using the exposure apparatus according to claim 13 to form an image of the substantially 1D diffractive structure onto a workpiece; and
processing the workpiece on which the image of the substantially 1D diffractive structure has been formed.

15. A catoptric system having a reference axis and operable to form an image of a pattern-source, the system comprising:
first, second, and third reflectors situated on the reference axis and a reflective element, situated on the reference axis between the second reflector and the third reflector, the first reflector including the pattern-source; and
a combination of the second and third reflectors configured to form the image with a reduction factor N>1, of a substantially one-dimensional (1D) diffractive structure of the pattern-source in extreme UV light provided by only two diffracted beams of light, in a plane that is optically-conjugate to the first reflector, wherein the only two diffracted beams of light originate at the first reflector as a result of irradiation of the first reflector with an illumination beam of light, and
wherein the only two diffracted beams of light do not include a beam of light that represents a specular reflection of the illumination beam of light at the first reflector,
the second reflector includes a convex reflector unit defining a first opening therein,
the third reflector includes a concave reflector unit defining a second opening therein,
the reflective element is situated to reflect the illumination beam of light to the pattern-source,
the system configured to:
receive, at a surface of the convex reflector unit, the two diffracted beams of light delivered thereto through the second opening defined in the third reflector,
receive, at the concave reflector unit, the two diffracted beams of light from the surface of the convex reflector unit and reflect the two diffracted beams of light through the first opening defined in the second reflector to form the image of the pattern-source at an image plane;
wherein the two diffracted beams of light are generated at the pattern-source in response to the irradiating with the illumination beam received from the reflective element, and wherein the reflective element is situated to block light from the pattern-source and passing between the two diffracted beams of radiation produced at the pattern-source.

16. A catoptric system according to claim 15, wherein the combination is configured to not reduce contrast of the image in a spatial-frequency-dependent fashion.

17. A catoptric system according to claim 15, wherein the combination is configured to form the image with contrast that remains substantially unchanged across an area of the image.

18. A catoptric system according to claim 15, wherein the first reflector has a first radius of curvature, the second reflector has a second radius of curvature, and the first and second radii of curvature have opposite signs.

19. A catoptric system according to claim 15, wherein the first reflector includes a 1D diffraction grating defined at a curved surface.

20. A catoptric system according to claim 15, wherein the first reflector includes a phase-shift mask.

21. A catoptric system according to claim 15, wherein the only two diffracted beams of light do not include a beam of light that is substantially co-directional with the reference axis.

22. A catoptric system according to claim 15, wherein the diffractive structure has a first spatial frequency, the image has a second spatial frequency, and the second spatial frequency is at least twice the first spatial frequency.

23. An exposure apparatus comprising:
the catoptric system according to claim 15; and
an illumination optical system configured to generate the illumination beam and disposed to direct the illumination beam to the catoptric system.

24. A device manufacturing method comprising:
exposing the substantially 1D diffractive structure to radiation with using the exposure apparatus according to claim 23 to form the image of the substantially 1D diffractive structure on a workpiece; and
processing the workpiece on which the image of the substantially 1D diffractive structure has been formed.

25. A catoptric system having a reference axis and comprising:
a first pair of reflector elements that are symmetric to one another about the reference axis, each surface of the first pair of reflectors having a convex surface;
a second pair of reflector elements that are symmetric to one another about the reference axis, each surface of the second pair of reflectors having a concave surface, wherein reflecting surfaces of the reflector elements from the first pair and face reflecting surfaces of the reflector elements from the second pair; and
an illumination element disposed on the reference axis between the first pair of reflector elements and the second pair of reflector elements,
the catoptric system configured to:
receive, at the surfaces of the first pair of reflectors, optical radiation in a form of two diffracted beams of radiation delivered thereto from between the second pair of reflector elements, and
form an image of an object by irradiating an image plane with optical radiation after the optical radiation has been reflected from the surfaces of the second pair of reflectors and after the optical radiation has passed between the first pair of reflectors,
wherein the illumination element is situated to reflect an illumination radiation to the object, the two diffracted beams of radiation are generated at a substantially one-dimensional (1D) diffractive structure defined by the object in response to the illumination radiation received from the illumination element, and the illumination element is situated to block light passing between the two diffracted beams of radiation originating at the object.

26. A catoptric system according to claim 25, wherein each of the reflecting surfaces of the reflecting elements from the first pair is convex.

27. A catoptric system according to claim 25, wherein each of the reflecting surfaces of the reflecting elements from the second pair is concave.

28. A catoptric system according to claim 25, wherein the reflecting surfaces of the reflector elements from the first pair are symmetric to one another about a plane containing an optical axis.

29. A catoptric system according to claim 25, wherein the reflecting surfaces of the reflector elements from the second pair are symmetric to one another about a plane containing an optical axis.

30. A catoptric system according to claim 25, wherein
the reflector elements from the first pair are separated from one another with a first gap along a first axis that is transverse to the reference axis; and
the catoptric system is configured to image the substantially 1D diffractive structure onto an image plane with a reduction ratio having a value between 4 and 6, the image plane being separated from the second pair by the first pair.

31. A catoptric system according to claim 30, wherein the reduction ratio is equal to 5 and a length of the catoptric system is about 1.5 m, the length defined by a distance separating the first pair of reflectors from the second pair of reflectors.

32. A catoptric system according to claim 30, further comprising a patterned reflector, the patterned reflector defining the substantially 1D diffractive structure thereon, wherein the system is configured to image the substantially 1D diffractive structure onto the image plane at a wavelength of about 13.5 nm, the substantially 1D diffractive structure characterized by a pattern period between 40 nm and 60 nm.

33. A catoptric system according to claim 32, wherein a surface of the patterned reflector is planar.

34. A catoptric system according to claim 32, wherein a surface carrying the substantially 1D diffractive structure is curved.

35. A catoptric system according to claim 30, wherein a working distance is about 30 mm, the working distance defined by a separation between the image plane and a vertex of a surface containing both of the reflecting surfaces of the reflecting elements from the first pair.

36. A catoptric system according to claim 30, wherein the reduction ratio is equal to 5 and a length of the catoptric system is about 0.3 m, the length defined by a distance separating the first pair of reflectors from the second pair of reflectors.

37. A catoptric system according to claim 36, having a working distance of about 25 mm, the working distance defined by a separation between the image plane and a vertex of a surface containing both of the reflecting surfaces of the reflecting elements from the first pair.

38. A catoptric system according to claim 25, wherein a reflecting surface of one of the reflector elements from the first pair is defined as a first portion of a first surface that is rotationally-symmetric about an optical axis, and
wherein a reflecting surface of another of the reflector elements from the first pair is defined as a portion of the surface that is rotationally-symmetric about the reference axis.

39. A catoptric system according to claim 25, further comprising an auxiliary reflector disposed on the reference axis between the first and second pairs of reflector elements.

40. A lithographic exposure tool comprising the catoptric system according to claim 25, the catoptric system configured as a projection optics portion of an optical system of the lithographic exposure tool.

41. A catoptric system having a reference axis and comprising:
  a primary mirror unit made of a first material and having a first area centered on the reference axis, the first area being devoid of the first material;
  a secondary mirror unit made of a second material and having a second area centered on the reference axis, the second area being devoid of the second material; and
  a reflective illumination element situated on the reference axis between the primary mirror unit and the secondary mirror unit,
  the catoptric system having a length defined by distance separating the primary mirror unit and the secondary mirror unit, the length equal to approximately 0.3 m,
  the catoptric system configured to image a substantially one-dimensional (1D) diffractive structure through the first and second areas onto an image plane in extreme UV light with a reduction ratio between 4 and 6,
  wherein the substantially 1D diffractive structure is characterized by a pattern period between 40 nm and 60 nm and is associated with a curved surface of an object, and
  wherein the image plane is separated from the primary mirror unit by about 25 mm and is separated from the secondary mirror unit by the primary mirror unit,
  the primary mirror unit having a concave reflecting surface,
  the secondary mirror unit having a convex reflecting surface,
  the system configured to:
  receive, at the convex reflecting surface of the secondary mirror unit, optical radiation in a form of two diffracted beams of radiation delivered thereto through the first area of the primary mirror unit, and
  form an image of an object by irradiating an image plane with the optical radiation after the optical radiation has been reflected from the concave reflecting surface of the primary mirror unit and after the optical radiation has passed through the second area of the secondary mirror unit,
  wherein the reflective illumination element is situated to reflect illumination radiation to the object, the two diffracted beams of radiation being generated at the object in response to the illumination radiation received from the reflective illumination element, and to block light propagating from the object between the two diffracted beams of radiation.

42. A catoptric system according to claim 41, wherein at least one of the primary and secondary mirrors contains two spatially-separated reflector elements.

43. A catoptric system according to claim 42, wherein reflecting surfaces of the two spatially-separated reflector elements are symmetric to one another about a plane containing the reference axis.

44. A catoptric system according to claim 41, further comprising a patterned reflector, the patterned reflector carrying the substantially 1D diffractive structure thereon, wherein a surface containing the substantially 1D diffractive structure is spatially curved.

* * * * *